United States Patent
Ahn et al.

(10) Patent No.: US 11,908,797 B2
(45) Date of Patent: Feb. 20, 2024

(54) INTEGRATED CIRCUIT DEVICE HAVING A BIT LINE AND A MAIN INSULATING SPACER WITH AN EXTENDED PORTION

(71) Applicant: SAMSUNG ELECTRONICS CO., LTD., Suwon-si (KR)

(72) Inventors: Jiyoung Ahn, Seoul (KR); Seunguk Han, Suwon-si (KR); Sunghwan Kim, Yeongcheon-si (KR); Seoryong Park, Ansan-si (KR); Kiseok Lee, Seoul (KR); Yoonyoung Choi, Seoul (KR); Taehee Han, Hwaseong-si (KR); Jiseok Hong, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 301 days.

(21) Appl. No.: 17/129,083

(22) Filed: Dec. 21, 2020

(65) Prior Publication Data

US 2021/0391259 A1    Dec. 16, 2021

(30) Foreign Application Priority Data

Jun. 16, 2020 (KR) .................. 10-2020-0073249

(51) Int. Cl.
*H01L 23/528* (2006.01)
*H01L 29/06* (2006.01)
(Continued)

(52) U.S. Cl.
CPC ........ *H01L 23/5283* (2013.01); *H01L 21/764* (2013.01); *H01L 21/7682* (2013.01); *H01L 29/0649* (2013.01); *H10B 12/482* (2023.02);

*H10B 12/485* (2023.02); *H10B 12/488* (2023.02); *H01L 23/5222* (2013.01);
(Continued)

(58) Field of Classification Search
CPC .................. H01L 27/10805–10841; H01L 27/10847–10891; H01L 21/764; H01L 21/7682; H01L 29/0649; H01L 27/10885; H01L 27/10814; H10B 12/482;
(Continued)

(56) References Cited

U.S. PATENT DOCUMENTS 8,187,932 B2   5/2012   Nguyen et al.
8,470,673 B2   6/2013   Dong et al.
(Continued)

FOREIGN PATENT DOCUMENTS

KR   10-2002-0037851 A    5/2002
TW       201110301 A1     3/2011
(Continued)

OTHER PUBLICATIONS

CN202010478418 filed on May 29, 2020.*
(Continued)

*Primary Examiner* — Younes Boulghassoul
(74) *Attorney, Agent, or Firm* — Fish & Richardson P.C.

(57) ABSTRACT

An integrated circuit device is provided. The integrated circuit device includes: a bit line on a substrate, the bit line including a lower conductive layer and an upper conductive layer; an insulating capping pattern on the bit line; and a main insulating spacer on a sidewall of the bit line and a sidewall of the insulating capping pattern, the main insulating spacer including an extended portion that is convex toward the upper conductive layer.

17 Claims, 24 Drawing Sheets

(51) Int. Cl.
*H10B 12/00* (2023.01)
*H01L 23/522* (2006.01)
*H01L 21/768* (2006.01)
*H01L 21/764* (2006.01)

(52) U.S. Cl.
CPC ........ *H10B 12/0335* (2023.02); *H10B 12/315* (2023.02); *H10B 12/34* (2023.02)

(58) Field of Classification Search
CPC ...... H10B 12/485; H10B 12/033–0335; H10B 12/053; H10B 12/315; H10B 12/34
See application file for complete search history.

(56) References Cited

U.S. PATENT DOCUMENTS

| | | |
|---|---|---|
| 9,425,200 B2 | 8/2016 | Hwang et al. |
| 9,472,644 B2 | 10/2016 | Sung |
| 9,620,451 B2 | 4/2017 | Hwang et al. |
| 10,418,367 B2 | 9/2019 | Chang et al. |
| 10,490,446 B2 | 11/2019 | Park et al. |
| 10,535,605 B2 | 1/2020 | Kim et al. |
| 10,559,569 B2 | 2/2020 | Jang et al. |
| 10,629,809 B2 | 4/2020 | Yamakawa |
| 11,121,135 B1* | 9/2021 | Ikeda ................ H01L 23/53266 |
| 2011/0057240 A1 | 3/2011 | Park |
| 2011/0057340 A1 | 3/2011 | Perichaud et al. |
| 2016/0086955 A1* | 3/2016 | Wu ....................... H10B 12/482 |
| | | 257/306 |
| 2016/0126246 A1 | 5/2016 | Lee |
| 2017/0005097 A1* | 1/2017 | Kim ...................... H01L 23/528 |
| 2017/0317079 A1 | 11/2017 | Kim et al. |
| 2018/0211964 A1 | 7/2018 | Feng et al. |
| 2019/0067294 A1* | 2/2019 | Lee ................... H01L 27/10888 |
| 2019/0206876 A1* | 7/2019 | Yuki ................. H01L 27/10897 |
| 2020/0020697 A1 | 1/2020 | Kim et al. |
| 2020/0035541 A1* | 1/2020 | Chun .................... H01L 21/764 |
| 2020/0119009 A1 | 4/2020 | Kim et al. |
| 2021/0074708 A1* | 3/2021 | Huang ................ H01L 23/5283 |
| 2021/0375878 A1* | 12/2021 | Zhang ................. H10B 12/315 |

FOREIGN PATENT DOCUMENTS

| | | |
|---|---|---|
| TW | 201142985 A1 | 12/2011 |
| TW | 201250993 A1 | 12/2012 |
| TW | 201839856 A | 11/2018 |
| TW | 201937602 A | 9/2019 |
| TW | 202008359 A | 2/2020 |

OTHER PUBLICATIONS

Communication dated Apr. 8, 2022 issued by the Taiwan Intellectual Property Office in TW Patent Application No. 110106413.

* cited by examiner (a) A-A'    (b) B-B'

(a) A-A'  (b) B-B'

INTEGRATED CIRCUIT DEVICE HAVING A BIT LINE AND A MAIN INSULATING SPACER WITH AN EXTENDED PORTION

CROSS-REFERENCE TO THE RELATED APPLICATION

This application claims priority from Korean Patent Application No. 10-2020-0073249, filed on Jun. 16, 2020, in the Korean Intellectual Property Office, the disclosure of which is incorporated herein by reference in its entirety.

BACKGROUND

1. Field

Methods, apparatuses and systems consistent with example embodiments relate to an integrated circuit device, and more particularly, to an integrated circuit device including a plurality of conductive lines.

2. Related Art

Recently, as down-scaling of integrated circuit devices has progressed rapidly, spaces between each of a plurality of conductive lines are reduced, and accordingly, separation distances between the plurality of conductive lines and other conductive regions between the plurality of conductive lines have gradually decreased. Accordingly, there is a need to develop a technology for implementing an integrated circuit device having secured reliability by suppressing parasitic capacitance between the plurality of conductive lines and other conductive regions adjacent thereto.

SUMMARY

Example embodiments provide an integrated circuit device capable of suppressing parasitic capacitance between a conductive line and another conductive line adjacent thereto even when an area of a device region is reduced according to down-scaling of a semiconductor device.

According to an aspect of an example embodiment, there is provided an integrated circuit device including: a bit line on a substrate, the bit line including a lower conductive layer and an upper conductive layer; an insulating capping pattern on the bit line; and a main insulating spacer on a sidewall of the bit line and a sidewall of the insulating capping pattern, the main insulating spacer including an extended portion that is convex toward the upper conductive layer.

According to an aspect of an example embodiment, there is provided an integrated circuit device including: a bit line including a lower conductive layer and an upper conductive layer on the lower conductive layer in a vertical direction, the lower conductive layer being on a substrate and the upper conductive layer having a width less than a width of the lower conductive layer in a horizontal direction; an insulating capping pattern on the upper conductive layer in the vertical direction, the insulating capping pattern having a width greater than the width of the upper conductive layer in the horizontal direction; and a main insulating spacer on a sidewall of the bit line and a sidewall of the insulating capping pattern, the main insulating spacer including an extended portion that is convex toward the upper conductive layer.

According to an aspect of an example embodiment, there is provided an integrated circuit device including: a substrate including a plurality of active regions apart from each other, the plurality of active regions including a first active region and a second active region adjacent to the first active region; a bit line connected to the first active region and including the bit line including a lower conductive layer and an upper conductive layer stacked on the substrate in a vertical direction; an insulating capping pattern on the bit line; a contact plug adjacent to the bit line in a horizontal direction, the contact plug being connected to the second active region; and a spacer structure between the bit line and the contact plug, wherein the spacer structure includes a main insulating spacer comprising an extended portion that is convex toward the upper conductive layer.

BRIEF DESCRIPTION OF THE DRAWINGS

The above and other objects and features will become more apparent from the following description of example embodiments with reference to the accompanying drawings in which.

DETAILED DESCRIPTION

Figure 1:
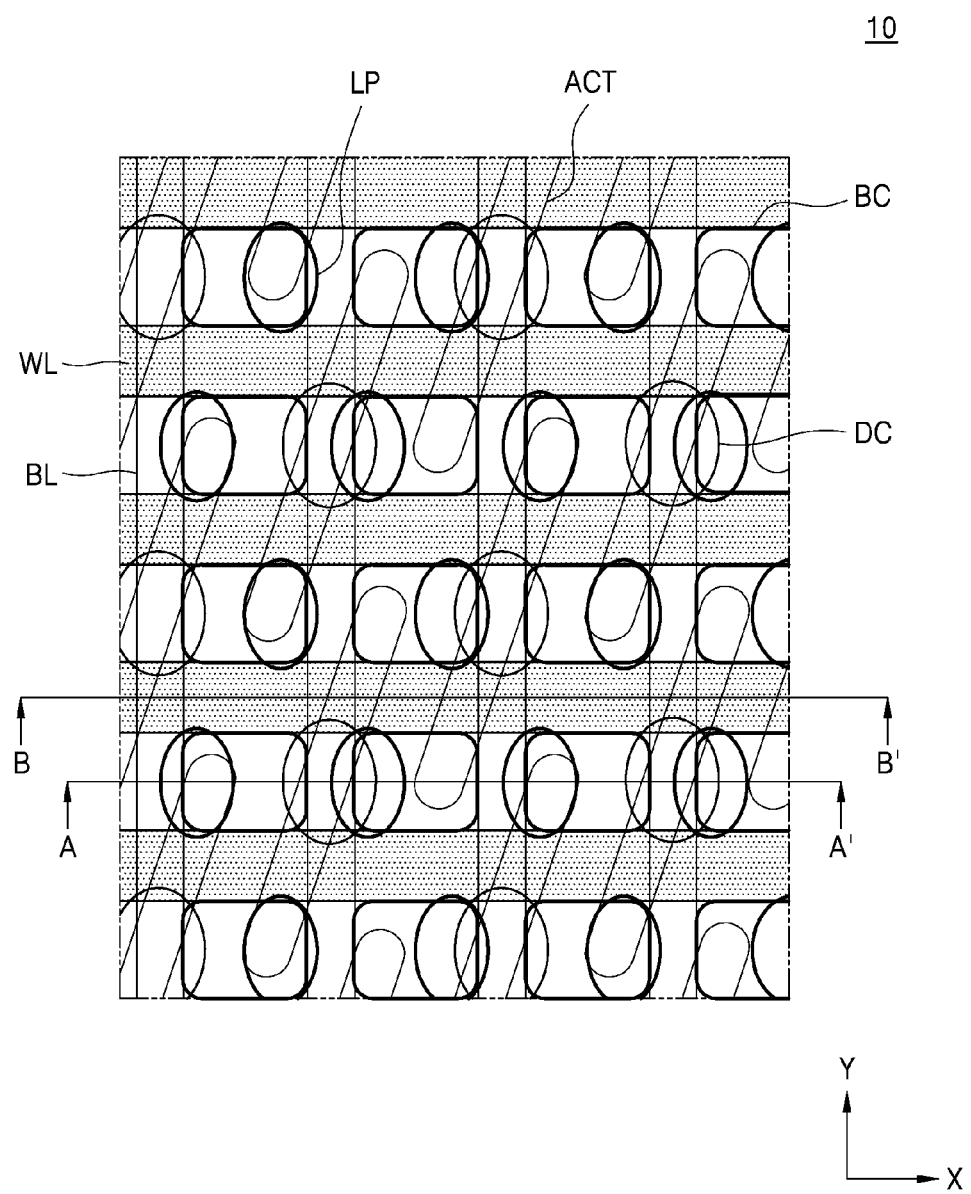
FIG. 1 is a schematic planar layout of components of a memory cell array region of an integrated circuit device, according to an example embodiment.

Hereinafter, example embodiments will be described in detail with reference to the accompanying drawings. Identical reference numerals are used for the same constituent devices in the drawings, and a duplicate description thereof will be omitted.

FIG. 1 is a schematic planar layout of main components of a memory cell array area of an integrated circuit device 10, according to an example embodiment.

Referring to FIG. 1, the integrated circuit device 10 may include a plurality of active regions ACT. The plurality of active regions ACT may be arranged in a diagonal direction with respect to a first horizontal direction (X direction) and a second horizontal direction (Y direction).

A plurality of word lines WL may extend in parallel with each other in the first horizontal direction (X direction) across the plurality of active regions ACT. On the plurality of word lines WL, a plurality of bit lines BL may extend in parallel with each other in the second horizontal direction (Y direction) across the first horizontal direction (X direction). The plurality of bit lines BL may be connected to the plurality of active regions ACT via direct contacts DC.

A plurality of buried contacts BC may be between two adjacent bit lines BL among the plurality of bit lines BL. In example embodiments, the plurality of buried contacts BC may be arranged in a line in the first horizontal direction (X direction) and the second horizontal direction (Y direction), respectively. A plurality of conductive landing pads LP may respectively be formed on the plurality of buried contacts BC. The plurality of buried contacts BC and the plurality of conductive landing pads LP may connect bottom electrodes of capacitors formed on top portions of the plurality of bit lines BL to the active region ACT. At least a portion of each of the plurality of conductive landing pads LP may vertically overlap the buried contact BC.

Next, example configurations of integrated circuit devices according to example embodiments are described with reference to FIGS. 2A through 6. Each of the integrated circuit devices illustrated in FIGS. 2A through 6 may have a layout of the integrated circuit device 10 illustrated in FIG. 1.

Figure 2A:
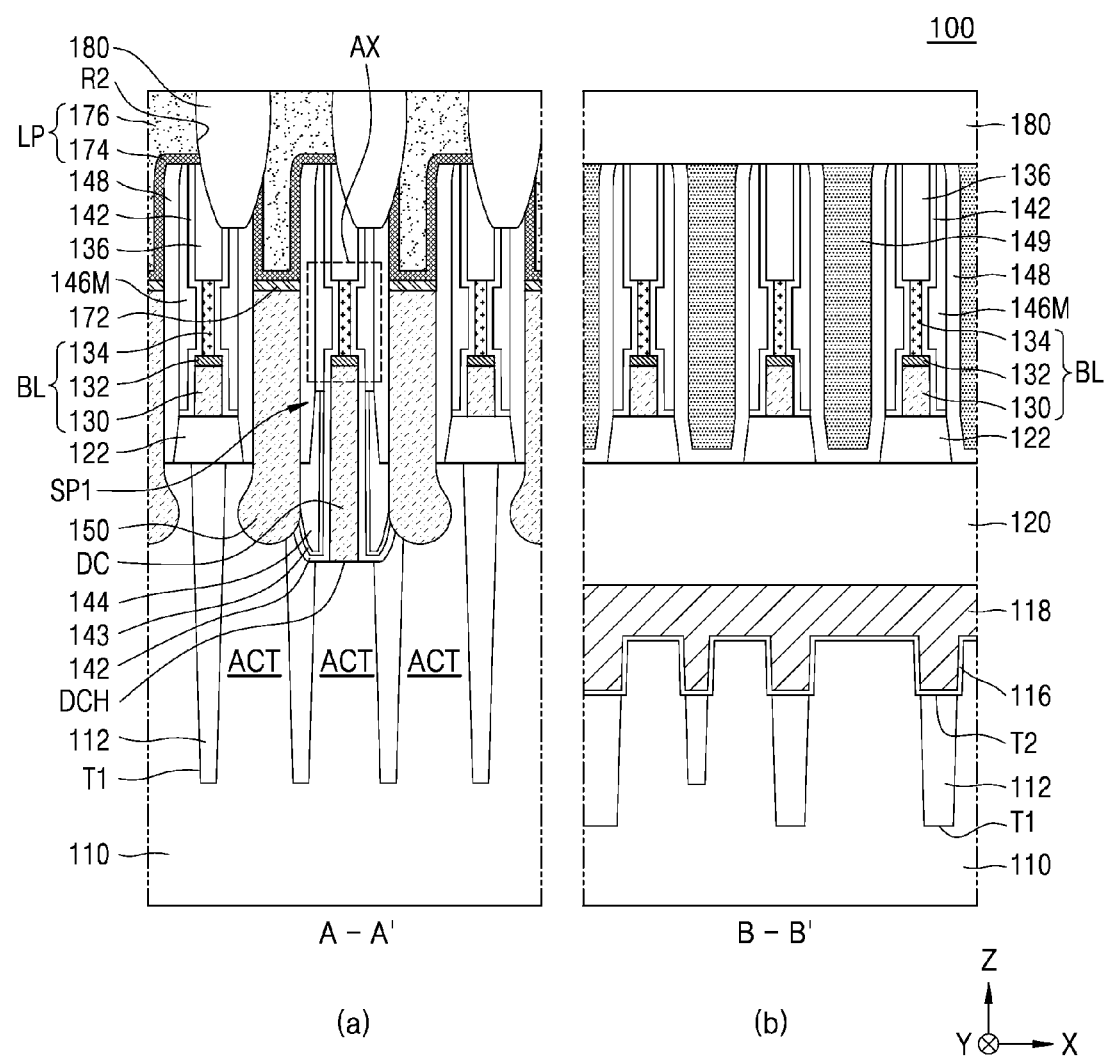
FIG. 2A is a cross-sectional view of an integrated circuit device according to an example embodiment.
Figure 2B:
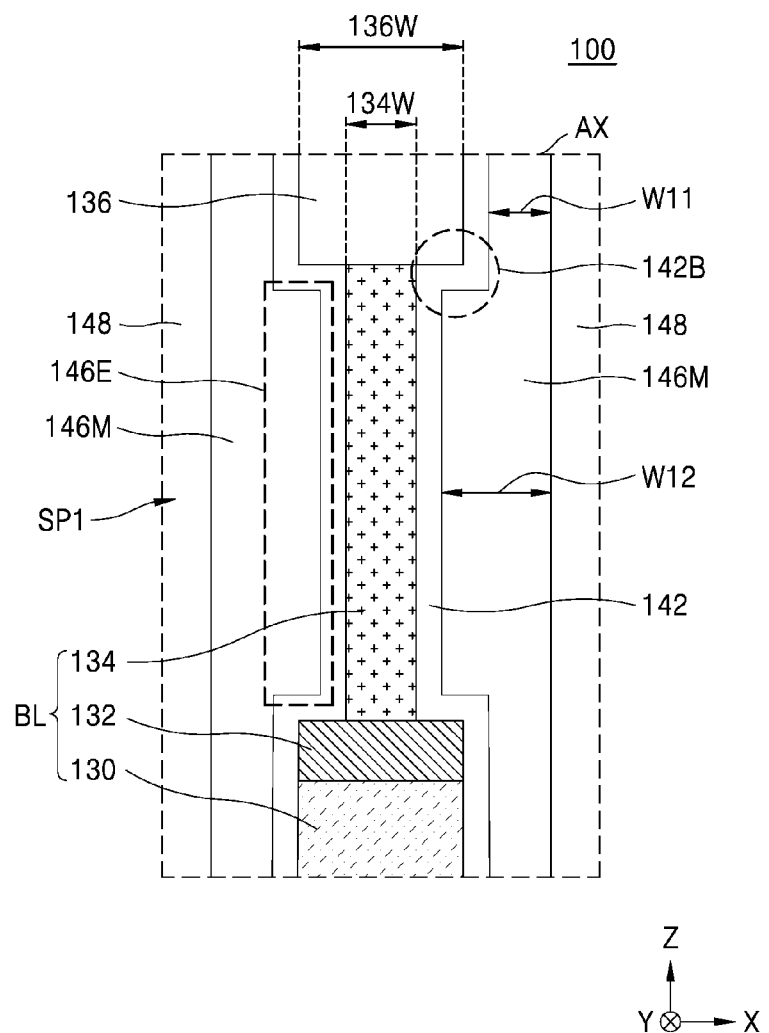
FIG. 2B is an enlarged cross-sectional view of a portion corresponding to a dashed region AX in portion (a) in FIG. 2A.

FIGS. 2A and 2B are cross-sectional views of example configurations of an integrated circuit device 100, according to example embodiments. In FIG. 2A, portion (a) is a cross-sectional view of some components of a portion corresponding to a cross-section taken along line A-A' in FIG. 1, and portion (b) is a cross-sectional view of some components of a portion corresponding to a cross-section taken along line B-B' in FIG. 1. FIG. 2B is an enlarged cross-sectional view of a portion corresponding to the dashed line region AX in portion (a) in FIG. 2A.

Referring to FIGS. 2A and 2B, the integrated circuit device 100 may include a substrate 110 in which a plurality of active regions ACT are defined by a device isolation layer 112. The device isolation layer 112 may be in a device isolation trench T1 in the substrate 110.

The substrate 110 may include silicon, for example, monocrystalline silicon, polycrystalline silicon, or amorphous silicon. In other example embodiments, the substrate 110 may include at least one of Ge, SiGe, SiC, GaAs, InAs, and InP. In example embodiments, the substrate 110 may include a conductive area, for example, a well doped with an impurity, or a structure doped with an impurity. The device isolation layer 112 may include an oxide layer, a nitride layer, or a combination thereof.

A plurality of word line trenches T2 extending in the first horizontal direction (X direction) may be in the substrate 110, and a plurality of gate dielectric layers 116, a plurality of word lines 118, and a buried insulating layer 120 may be in the plurality of word line trenches T2. The plurality of word lines 118 may correspond to the plurality of word lines WL illustrated in FIG. 1.

The gate dielectric layer 116 may include at least one of a silicon oxide layer, a silicon nitride layer, a silicon oxynitride layer, an oxide/nitride/oxide (ONO) layer, and a high-k dielectric layer having a higher dielectric constant than the silicon oxide layer. The high-k dielectric layer may include $HfO_2$, $Al_2O_3$, $HfAlO_3$, $Ta_2O_3$, $TiO_2$, or a combination thereof. The plurality of word lines 118 may include Ti, TiN, Ta, TaN, W, WN, TiSiN, WSiN, or a combination thereof. The plurality of buried insulating layers 120 may include a silicon oxide layer, a silicon nitride layer, a silicon oxynitride layer, or a combination thereof.

A buffer layer 122 may be on the substrate 110. The buffer layer 122 may cover top surfaces of the plurality of active regions ACT, a top surface of the device isolation layer 112, and top surfaces of the plurality of buried insulating layers 120. The buffer layer 122 may include a first silicon oxide layer, a silicon nitride layer, and a second silicon oxide layer sequentially formed on the substrate 110, but is not limited thereto.

A plurality of bit lines BL extending parallel to each other in the second horizontal direction (Y direction) may be on the buffer layer 122. The plurality of bit lines BL may be spaced apart from each other in the first horizontal direction (X direction). A direct contact DC may be on a portion of each of the plurality of active regions ACT. Each of the plurality of bit lines BL may be connected to the active region ACT via the direct contact DC. The direct contact DC may include Si, Ge, W, WN, Co, Ni, Al, Mo, Ru, Ti, TiN, Ta, TaN, Cu, or a combination thereof. In example embodiments, the direct contact DC may include a doped polysilicon layer.

Each of the plurality of bit lines BL may be covered by an insulating capping pattern 136. In a vertical direction (Z direction), the insulating capping pattern 136 may be on an upper conductive layer 134. A top surface of the upper conductive layer 134 may contact a bottom surface of the insulating capping pattern 136.

Each of the plurality of bit lines BL may include a lower conductive layer 130, an intermediate conductive layer 132, and the upper conductive layer 134 sequentially stacked on the substrate 110 in the vertical direction (Z direction). In the vertical direction (Z direction), the intermediate conductive layer 132 may be on the lower conductive layer 130, and the upper conductive layer 134 may be on the intermediate conductive layer 132. A width 134W of the upper conductive layer 134 in the first horizontal direction (X direction) may be less than a width 136W of the bottom surface of the insulating capping pattern 136, and less than each width of the lower conductive layer 130 and the intermediate conductive layer 132. Accordingly, sidewalls of each of the plurality of bit lines BL may extend nonlinearly in the vertical direction (Z direction). In example embodiments, the width 136W of the bottom surface of the insulating capping pattern 136 may be about 5 nm to about 20 nm, and a difference between the width 134W of the upper conductive layer 134 and the width 136W of the bottom surface of the insulating capping pattern 136 may be about 0.1 nm to about 10 nm. For example, the width 136W of the bottom surface of the insulating capping pattern 136 may be about 5 nm to about 10 nm, and a difference between the width 134W of the upper conductive layer 134 and the width 136W of the bottom surface of the insulating capping pattern 136 may be about 0.1 nm to about 5 nm. However, example embodiments are not limited thereto.

As illustrated in FIGS. 2A and 2B, the width 134W of the upper conductive layer 134 in the first horizontal direction (X direction) may be constant in the vertical direction (Z direction). However, example embodiments are not limited thereto. For example, the width 134W of the upper conductive layer 134 in the first horizontal direction (X direction) may vary in the vertical direction (Z direction).

A top surface of the lower conductive layer 130 of the bit line BL may be on the same plane as a top surface of the direct contact DC. In FIG. 2A, it is illustrated that the plurality of bit lines BL have a triple conductive layer structure including the lower conductive layer 130, the intermediate conductive layer 132, and then upper conductive layer 134, but example embodiments are not limited thereto. For example, the plurality of bit lines BL may have a single conductive layer, a double conductive layer, or a stack structure of a plurality of conductive layers, for example, four or more conductive layers.

In example embodiments, the lower conductive layer 130 may include a doped polysilicon layer. Each of the intermediate conductive layer 132 and the upper conductive layer 134 may include a layer including Ti, TiN, TiSiN, tungsten (W), WN, tungsten silicide (WSix), tungsten silicon nitride (WSixNy), ruthenium (Ru), or combination thereof. For example, the intermediate conductive layer 132 may include a TiN layer and/or a TiSiN layer, and the upper conductive layer 134 may include a layer including Ti, TiN, W, WN, WSixNy, Ru, or a combination thereof. The insulating capping pattern 136 may include a silicon nitride layer.

A plurality of contact plugs 150 may be on the substrate 110. The plurality of contact plugs 150 may have a pillar shape extending in the vertical direction (Z direction) in a space between each of the plurality of bit lines BL. Each of the plurality of contact plugs 150 may contact the active region ACT. The lower end of each of the plurality of contact plugs 150 may be at a level lower than the top surface of the substrate 110 so that the lower end of each of the plurality of contact plugs 150 is buried in the substrate 110. The plurality of contact plugs 150 may include a semiconductor material doped with impurities, a metal, a conductive metal nitride, or a combination thereof, but is not limited thereto.

In the integrated circuit device 100, one direct contact DC and a pair of contact plugs 150 facing each other with the one direct contact DC interposed therebetween may be connected to different active regions AC among the plurality of active regions AC.

The plurality of contact plugs 150 may be arranged in a row in the second horizontal direction (Y direction) between a pair of bit lines BL adjacent to each other selected from the plurality of bit lines BL. An insulating fence 149 may be between each of the plurality of contact plugs 150 arranged in a row in the second horizontal direction (Y direction). The plurality of contact plugs 150 may be insulated from each other by a plurality of insulating fences 149. Each of the plurality of insulating fences 149 may have a pillar shape extending in the vertical direction (Z direction) on the substrate 110. In example embodiments, the plurality of insulating fences 149 may include a silicon nitride layer.

The integrated circuit device 100 may include a plurality of spacer structures SP1 between the plurality of bit lines BL and the plurality of contact plugs 150. One spacer structure SP1 may be between one bit line BL and the plurality of contact plugs 150 arranged in a row in the second horizontal direction (Y direction). Each of the plurality of spacer structures SP1 may extend in parallel with the bit line BL.

Each of the plurality of spacer structures SP1 may include an inner insulating spacer 142, a first gap-fill insulating pattern 143, a second gap-fill insulating pattern 144, a main insulating spacer 146M, and an outer insulating spacer 148.

The inner insulating spacers 142 may contact a sidewall of the direct contact DC and a sidewall of the bit line BL, separately. The bit line BL may be spaced apart from the contact plug 150 in the first horizontal direction (X direction) with the inner insulating spacer 142, the main insulating spacer 146M, and the outer insulating spacer 148 interposed therebetween.

The inner insulating spacer 142 may conformally cover sidewalls of each of the bit lines BL and the insulating capping pattern 136. The inner insulating spacer 142 may contact sidewalls of each of the lower conductive layer 130, the intermediate conductive layer 132, and the upper conductive layer 134 of the bit line BL, sidewalls of the insulating capping pattern 136, and a top surface of the buffer layer 122. The inner insulating spacer 142 may be spaced apart from the contact plug 150 in the first horizontal direction (X direction) with the main insulating spacer 146M and the outer insulating spacer 148 interposed therebetween. The inner insulating spacer 142 may include a silicon nitride layer.

The main insulating spacer 146M may be between the inner insulating spacer 142 and the outer insulating spacer 148. The main insulating spacer 146M may be adjacent to the bit line BL in the first horizontal direction (X direction), and may cover the sidewalls of the bit line BL and the sidewalls of the insulating capping pattern 136. The main insulating spacer 146M may be spaced apart from the bit line BL with the inner insulating spacer 142 interposed therebetween.

The main insulating spacer 146M may include an extended portion 146E that convex toward the upper conductive layer 134. The extended portion 146E of the main insulating spacer 146M may fill an undercut space defined by the sidewall of the upper conductive layer 134 and the bottom surface of the insulating capping pattern 136. The extended portion 146E of the main insulating spacer 146M may include a portion overlapping the insulating capping pattern 136 in the vertical direction (Z direction). The extended portion 146E of the main insulating spacer 146M may be between the upper conductive layer 134 and the contact plug 150 in the first horizontal direction (X direction).

A first portion of the main insulating spacers 146M facing the insulating capping pattern 136 in the first horizontal direction (X direction) may have a first width W11 in the first horizontal direction (X direction). The first portion of the main insulating spacer 146M may include a portion arranged between the insulating capping pattern 136 and the outer insulating spacer 148.

A second portion of the main insulating spacer 146M facing the upper conductive layer 134 in the first horizontal direction (X direction) may include the extended portion 146E, and may have a second width W12 in the first horizontal direction (X direction), the second width W12 being greater than the first width W11. The second portion of the main insulating spacer 146M may include a portion arranged between the upper conductive layer 134 and the outer insulating spacer 148.

The main insulating spacer 146M may include a third portion between the lower conductive layer 130 and the contact plug 150, and between the intermediate conductive layer 132 and the contact plug 150. The third portion of the main insulating spacer 146M may have a width less than the second width W12 in the first horizontal direction (X direction). The third portion of the main insulating spacer 146M may include a portion arranged between the lower conductive layer 130 and the outer insulating spacer 148, and between the intermediate conductive layer 132 and the outer insulating spacer 148.

In the inner insulating spacer 142, a portion between the insulating capping pattern 136 and the main insulating spacer 146M and a portion between the upper conductive layer 134 and the extended portion 146E of the main insulating spacer 146M may be offset from each other in the vertical direction (Z direction). In addition, in the inner insulating spacer 142, a portion between the upper conductive layer 134 and the extended portion 146E of the main insulating spacer 146M and a portion between the lower conductive layer 130, the intermediate conductive layer 132, and the main insulating spacer 146M may be offset from each other in the vertical direction (Z direction). The inner insulating spacer 142 may include a bent portion 142B between the bottom surface of the insulating capping pattern 136 and the extended portion 146E of the main insulating spacer 146M. The inner insulating spacer 142 may include another bent portion between a top surface of the intermediate conductive layer 132 and the extended portion 146E of the main insulating spacer 146M. Accordingly, the inner insulating spacer 142 may extend non-linearly in the vertical direction (Z direction).

The extended portion 146E of the main insulating spacers 146M may include a sidewall that is defined by the inner insulating spacer 142 and convex toward the upper conductive layer 134, and may include a sidewall that is defined by the outer insulating spacer 148 on an opposite side of the extended portion 146E in the first horizontal direction (X direction) of the main insulating spacers 146M and is flat in the vertical direction (Z direction).

The outer insulating spacer 148 may be spaced apart from the inner insulating spacer 142 in the first horizontal direction (X direction) with the main insulating spacer 146M interposed therebetween. The outer insulating spacer 148 may be between the main insulating spacer 146M and the contact plug 150. A width of the main insulating spacer 146M in the first horizontal direction (X direction) may be limited by the inner insulating spacer 142 and the outer insulating spacer 148.

In example embodiments, the inner insulating spacer 142 may include a silicon nitride layer. The main insulating spacer 146M may include a silicon oxide layer, an air spacer, or a combination thereof. In the present specification, the term of "air" may be referred to as atmospheric or other gases that may be present during a manufacturing process. The outer insulating spacer 148 may include a silicon nitride layer. A portion of the inner insulating spacer 142 may be buried in the substrate 110. Some of the inner insulating spacers 142 may surround the first gap-fill insulating pattern 143 and the second gap-fill insulating pattern 144 at a level lower than the top surface of the substrate 110.

The first gap-fill insulating pattern 143 and the second gap-fill insulating pattern 144 may be between a lower end of the contact plug 150 and the direct contact DC. Sidewalls and bottom surfaces of the second gap-fill insulating pattern 144 may be surrounded by the first gap-fill insulating pattern 143 and the inner insulating spacer 142. Each of the inner insulating spacer 142 and the first gap-fill insulating pattern 143 may include a portion between the direct contact DC and the second gap-fill insulating pattern 144. The first gap-fill insulating pattern 143 may include a silicon oxide layer, and the second gap-fill insulating pattern 144 may include a silicon nitride layer.

In the integrated circuit device 100, the spacer structure SP1 between the bit line BL and the contact plug 150 may include the main insulating spacer 146M including the extended portion 146E that is convex toward the upper conductive layer 134. Accordingly, a sufficient insulating distance may be secured between the upper conductive layer 134 and the contact plug 150, and thus, parasitic capacitance may be reduced between the bit line BL and the contact plug 150 that are adjacent to each other.

A metal silicide layer 172 and a plurality of conductive landing pads LP may be sequentially formed on each of the plurality of contact plugs 150. The plurality of conductive landing pads LP may be connected to the plurality of contact plugs 150 via the metal silicide layer 172. The plurality of conductive landing pads LP may extend from the space between each of the plurality of insulating capping patterns 136 to the upper portion of each of the plurality of insulating capping patterns 136 so that the plurality of conductive landing pads LP vertically overlap a portion of the plurality of bit lines BL.

Each of the plurality of conductive landing pads LP may include a conductive barrier layer 174 and a conductive layer 176. In example embodiments, the metal silicide layer 172 may include cobalt silicide, nickel silicide, or manganese silicide, but example embodiments are not limited thereto. In example embodiments, the metal silicide layer 172 may be omitted. The conductive barrier layer 174 may have a Ti/TiN stack structure. The conductive layer 176 may include doped polysilicon, metal, metal silicide, conductive metal nitride, or a combination thereof. For example, the conductive layer 176 may include tungsten (W). The plurality of conductive landing pads LP may have a plurality of island-type pattern shapes in a plan view. The plurality of conductive landing pads LP may be electrically insulated from each other by an insulating layer 180 filling a space therearound.

Figure 3:
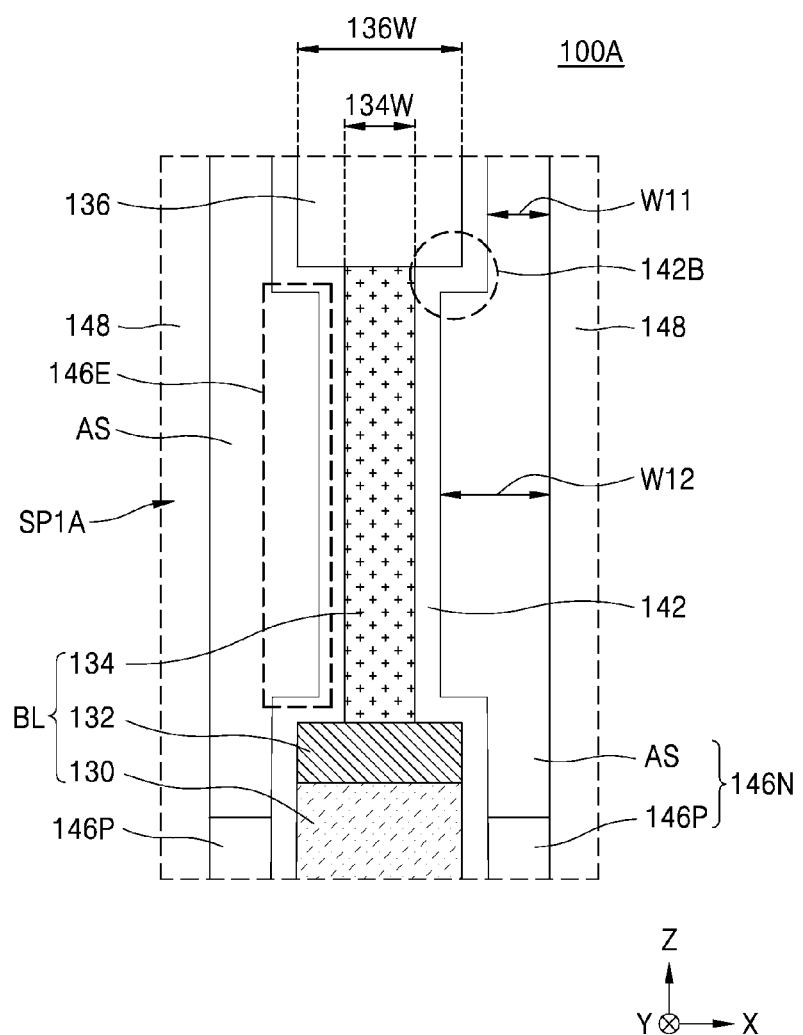
FIG. 3 is a cross-sectional view of an integrated circuit device according to an example embodiment.

FIG. 3 is a cross-sectional view of an integrated circuit device 100A according to an example embodiment. In FIG. 3, some components of a portion, of the integrated circuit device 100A, corresponding to the dashed region AX in portion (a) of FIG. 2A are enlarged and illustrated. In FIG. 3, the same reference numerals as those in FIGS. 2A and 2B denote the same members, and detailed descriptions thereof are omitted.

Referring to FIG. 3, the integrated circuit device 100A may have substantially the same configuration as the integrated circuit device 100 described with reference to FIGS. 2A and 2B. However, the integrated circuit device 100A may include a plurality of spacer structures SP1A instead of the plurality of spacer structures SP1 provided in the integrated circuit device 100.

The plurality of spacer structures SP1A may have substantially the same structure as the spacer structures SP1 illustrated in FIGS. 2A and 2B. However, the plurality of spacer structures SP1A may include a main insulating spacer 146N instead of the main insulating spacer 146M of the spacer structure SP1. The main insulating spacer 146N includes an air spacer AS and a main insulating spacer pattern 146P. The air spacer AS may form the extended portion 146E of the main insulating spacer 146N. The main insulating spacer pattern 146P among the air spacer AS and the main insulating spacer pattern 146P constituting the main insulating spacer 146N may be closer to the substrate 110 (refer to FIG. 2A). In example embodiments, the main insulating spacer pattern 146P may include a silicon oxide layer. In other example embodiments, the main insulating spacer pattern 146P may be omitted.

The air spacer AS of the integrated circuit device 100A may reduce parasitic capacitance between the bit line BL and the contact plug 150 adjacent to each other.

Figure 4:
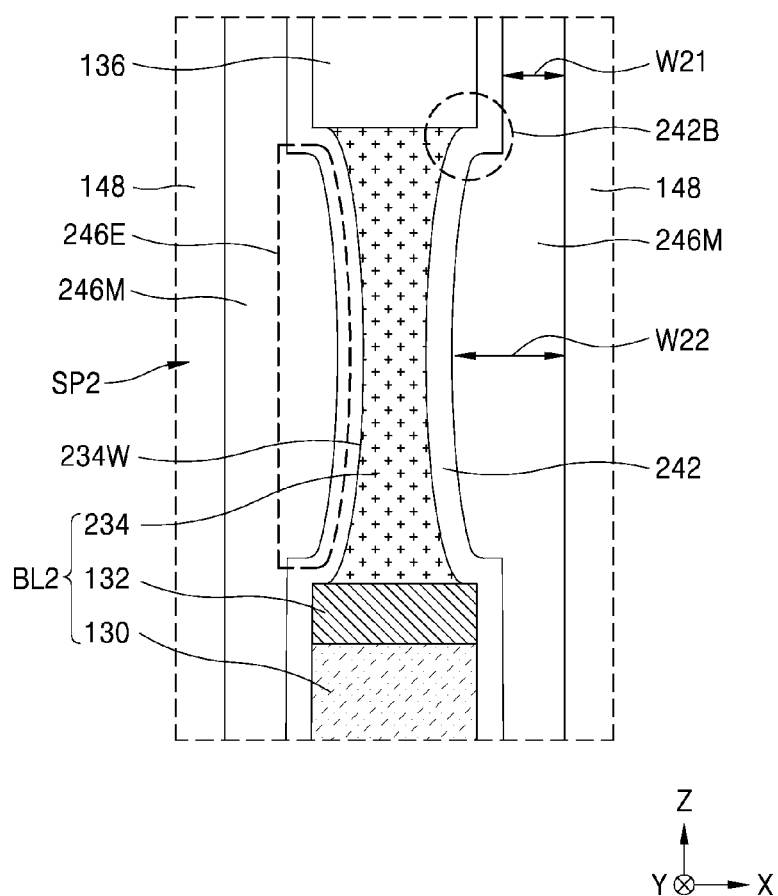
FIG. 4 is a cross-sectional view of an integrated circuit device according to another example embodiment.

FIG. 4 is a cross-sectional view of an integrated circuit device 200 according to another example embodiment. In FIG. 4, some components of a portion, of the integrated circuit device 200, corresponding to the dashed region AX in portion (a) of FIG. 2A are enlarged and illustrated. In FIG. 4, the same reference numerals as those in FIGS. 2A and 2B denote the same members, and detailed descriptions thereof are omitted.

Referring to FIG. 4, the integrated circuit device 200 may have substantially the same configuration as the integrated circuit device 100 described with reference to FIG. 2A. However, the integrated circuit device 200 may include a bit line BL2 and a plurality of spacer structures SP2 covering sidewalls of the bit line BL2.

The bit line BL2 may have substantially the same configuration as the bit line BL described with reference to FIGS. 2A and 2B. However, the bit line BL2 may include an upper conductive layer 234 instead of the upper conductive layer 134. The upper conductive layer 234 may include a nonlinear sidewall 234W which is concave toward the spacer structure SP2. The plurality of spacer structures SP2 may have substantially the same structure as the spacer structures SP1 illustrated in FIGS. 2A and 2B. However, the plurality of spacer structures SP2 may include an inner insulating spacer 242 and a main insulating spacer 246M instead of the inner insulating spacer 142 and the main insulating spacer 146M. The main insulating spacer 246M may include an extended portion 246E that is convex toward the upper conductive layer 234. The extended portion 246E of the main insulating spacer 246M may include a portion overlapping the insulating capping pattern 136 in the vertical direction (Z direction).

The inner insulating spacer 242 may have substantially the same configuration as the inner insulating spacer 142 described with reference to FIGS. 2A and 2B. However, the inner insulating spacer 242 may include a nonlinear portion facing the nonlinear sidewall 234W of the upper conductive layer 234. The inner insulating spacer 242 may include a bent portion 242B between the bottom surface of the insulating capping pattern 136 and the extended portion 246E of the main insulating spacer 246M. The inner insulating spacer 242 may include another bent portion between a top surface of the intermediate conductive layer 132 and the extended portion 246E of the main insulating spacer 246M.

The nonlinear sidewall 234W of the upper conductive layer 234 may face the extended portion 246E of the main insulating spacer 246M with the inner insulating spacer 242 interposed therebetween.

A first portion of the main insulating spacers 246M facing the insulating capping pattern 136 in the first horizontal direction (X direction) may have a first width W21 in the first horizontal direction (X direction). The first portion of the main insulating spacer 246M may include a portion arranged between the insulating capping pattern 136 and the outer insulating spacer 148.

A second portion of the main insulating spacer 246M facing the upper conductive layer 234 in the first horizontal direction (X direction) may include the extended portion 246E, and may have a second width W22 greater than the first width W21 in the first horizontal direction (X direction). The second portion of the main insulating spacer 246M may include a portion arranged between the upper conductive layer 234 and the outer insulating spacer 148.

For example, a width of the upper conductive layer 234 in the first horizontal direction (X direction) may vary in the vertical direction (Z direction). The width of the upper conductive layer 234 may have a minimum value at an approximately intermediate vertical level of the upper conductive layer 234 in the vertical direction (Z direction). The width of the upper conductive layer 234 may gradually increase from the middle vertical level of the upper conductive layer 234 to a top surface of the upper conductive layer 234, and may gradually increase from the middle vertical level of the upper conductive layer 234 toward a bottom surface of the upper conductive layer 234.

More detailed configurations of the upper conductive layer 234, the inner insulating spacer 242, and the main insulating spacer 246M may be substantially the same as descriptions of the upper conductive layer 134, the inner insulating spacer 142, and the main insulating spacer 146M, given with reference to FIGS. 2A and 2B.

Figure 5:
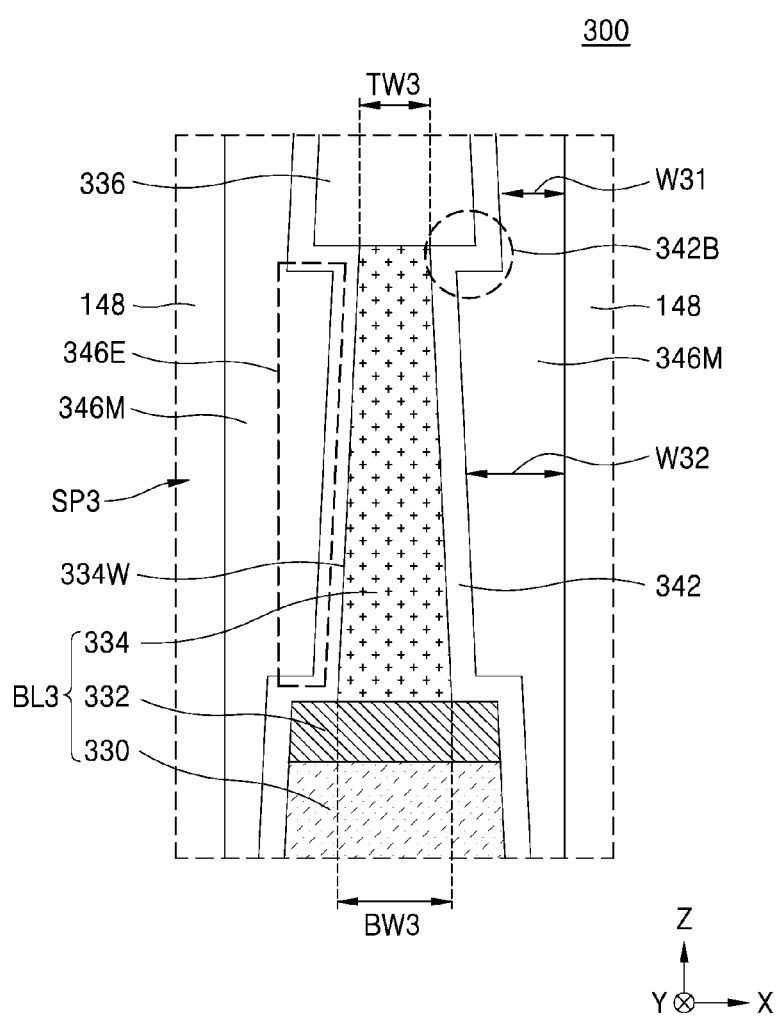
FIG. 5 is a cross-sectional view of an integrated circuit device according to another example embodiment.

FIG. 5 is a cross-sectional view of an integrated circuit device 300 according to another example embodiment. In FIG. 5, some components of a portion, of the integrated circuit device 300, corresponding to the dashed region AX in portion (a) of FIG. 2A are enlarged and illustrated. In FIG. 5, the same reference numerals as those in FIGS. 2A and 2B denote the same members, and detailed descriptions thereof are omitted.

Referring to FIG. 5, the integrated circuit device 300 may have substantially the same configuration as the integrated circuit device 100 described with reference to FIG. 2A. However, the integrated circuit device 300 may include a bit line BL3, an insulating capping pattern 336 covering the bit line BL3, and a plurality of spacer structures SP3 covering a sidewall of each of the bit lines BL3 and the insulating capping pattern 336.

The bit line BL3 may have substantially the same configuration as the bit line BL described with reference to FIGS. 2A and 2B. However, the bit line BL3 may include a lower conductive layer 330, an intermediate conductive layer 332, and an upper conductive layer 334 sequentially stacked on the substrate 110 in the vertical direction (Z direction). Each of the lower conductive layer 330, the intermediate conductive layer 332, the upper conductive layer 334, and the insulating capping pattern 336 may include an inclined sidewall facing the spacer structure SP3.

A plurality of spacer structures SP3 may have substantially the same structure as the spacer structures SP1 illustrated in FIGS. 2A and 2B. However, the plurality of spacer structures SP3 may include an inner insulating spacer 342 and a main insulating spacer 346M instead of the inner insulating spacer 142 and the main insulating spacer 146M. The main insulating spacer 346M may include an extended portion 346E that is convex toward the upper conductive layer 334. The extended portion 346E of the main insulating spacer 346M may include a portion overlapping the insulating capping pattern 336 in the vertical direction (Z direction).

The inner insulating spacer 342 may have substantially the same configuration as the inner insulating spacer 142 described with reference to FIGS. 2A and 2B. However, the inner insulating spacer 342 may include a slanted portion facing a slanted sidewall 334W of the upper conductive layer 334. The inner insulating spacer 342 may include a bent portion 342B between the bottom surface of the insulating capping pattern 336 and the extended portion 346E of the main insulating spacer 346M.

The slanted sidewall 334W of the upper conductive layer 334 may face the extended portion 346E of the main insulating spacer 346M with the inner insulating spacer 342 interposed therebetween.

A first portion of the main insulating spacers 346M facing the insulating capping pattern 336 in the first horizontal direction (X direction) may have a first width W31 in the first horizontal direction (X direction). The first portion of the main insulating spacer 346M may include a portion arranged between the insulating capping pattern 336 and the outer insulating spacer 148.

A second portion of the main insulating spacer 346M facing the upper conductive layer 334 in the first horizontal direction (X direction) may include the extended portion 346E, and may have a second width W32 greater than the first width W31 in the first horizontal direction (X direction). The second portion of the main insulating spacer 346M may include the portion arranged between the upper conductive layer 334 and the outer insulating spacer 148.

For example, a width of the upper conductive layer 334 in the first horizontal direction (X direction) may vary in the vertical direction (Z direction). The width of the upper conductive layer 334 may gradually increase toward the bottom surface of the upper conductive layer 334 in the vertical direction (Z direction). A width BW3 of the bottom surface of the upper conductive layer 334 may be greater than a width TW3 of a top surface of the upper conductive layer 334 in the first horizontal direction (X direction). Similarly, a width of the insulating capping pattern 336 may gradually increase toward the bottom surface of the insulating capping pattern 336 in the vertical direction (Z direction). Further, a width of the lower conductive layer 330 and the intermediate conductive layer 332 may gradually increase toward the same direction.

A width of a portion of the main insulating spacer 346M facing the upper conductive layer 334 in the first horizontal direction (X direction) may be variable in the vertical direction (Z direction). The width of the portion of the main insulating spacer 346M facing the upper conductive layer 334 may gradually increase from the bottom surface of the upper conductive layer 334 toward the top surface of the upper conductive layer 334 in the vertical direction (Z direction). The main insulating spacer 346M may have variable width to correspond to the variable widths of the lower conductive layer 330, the intermediate conductive layer 332 and the insulating capping pattern 336.

More detailed configurations of the lower conductive layer 330, the intermediate conductive layer 332, and the upper conductive layer 334 of the bit line BL3, the insulating capping pattern 336, the inner insulating spacer 342 of the spacer structure SP3, and the main insulating spacer 346M may be substantially the same as descriptions of the lower conductive layer 130, the intermediate conductive layer 132, and the upper conductive layer 134 of the bit line BL, and the insulating capping pattern 136, the inner insulating spacer 142 and the main insulating spacer 146M of the spacer structure SP1 given with reference to FIGS. 2A and 2B.

Figure 6:
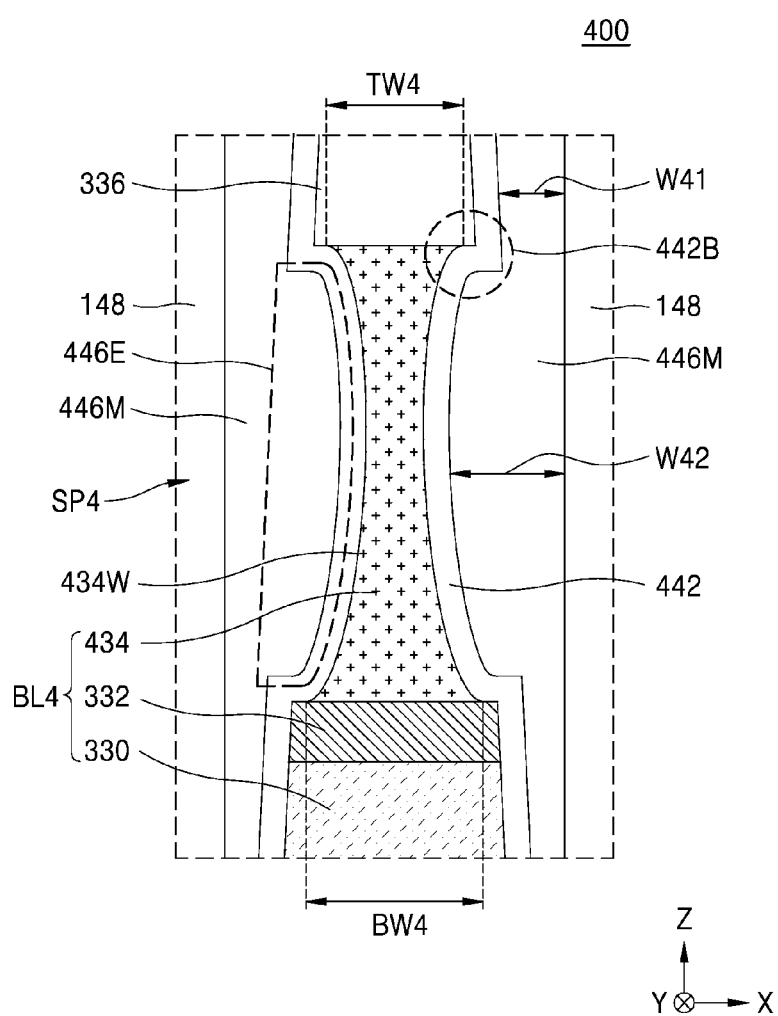
FIG. 6 is a cross-sectional view of an integrated circuit device according to another example embodiment.

FIG. 6 is a cross-sectional view of an integrated circuit device 400 according to another example embodiment. In FIG. 6, some components of a portion, of the integrated circuit device 400, corresponding to the dashed region AX in portion (a) of FIG. 2A are enlarged and illustrated. In FIG. 6, the same reference numerals as those in FIGS. 2A through 5 may denote the same members, and detailed descriptions thereof are omitted.

Referring to FIG. 6, the integrated circuit device 400 may have substantially the same configuration as the integrated circuit device 300 described with reference to FIG. 2A. However, the integrated circuit device 400 may include a bit line BL4 and a plurality of spacer structures SP4 covering sidewalls of the bit line BL4.

The bit line BL4 may include the lower conductive layer 330, the intermediate conductive layer 332, and an upper conductive layer 434 sequentially stacked on the substrate 110 in the vertical direction (Z direction).

The upper conductive layer 434 may include a nonlinear sidewall 434W concave toward the spacer structure SP4. A plurality of spacer structures SP4 may have substantially the same structure as the spacer structures SP3 illustrated in FIG. 5. However, the plurality of spacer structures SP4 may include an inner insulating spacer 442 and a main insulating spacer 446M instead of the inner insulating spacer 342 and the main insulating spacer 346M. The main insulating spacer 446M may include an extended portion 446E that is convex toward the upper conductive layer 434. The extended portion 446E of the main insulating spacer 446M may include a portion overlapping the insulating capping pattern 336 in the vertical direction (Z direction).

However, the inner insulating spacer 442 may include a nonlinear portion facing the nonlinear sidewall 434W of the upper conductive layer 434. The inner insulating spacer 442 may include a bent portion 442B between the bottom surface of the insulating capping pattern 336 and the extended portion 446E of the main insulating spacer 446M. The inner insulating spacer 442 may include another bent portion between the top surface of the intermediate conductive layer 332 and the bottom surface of the upper conductive layer 434.

The nonlinear sidewall 434W of the upper conductive layer 434 may face the extended portion 446E of the main insulating spacer 446M with the inner insulating spacer 442 interposed therebetween.

A first portion of the main insulating spacers 446M facing the insulating capping pattern 336 in the first horizontal direction (X direction) may have a first width W41 in the first horizontal direction (X direction). The first portion of the main insulating spacer 446M may include a portion arranged between the insulating capping pattern 336 and the outer insulating spacer 148.

A second portion of the main insulating spacer 436M facing the upper conductive layer 434 in the first horizontal direction (X direction) may include the extended portion 446E, and may have a second width W42 greater than the first width W41 in the first horizontal direction (X direction). The second portion of the main insulating spacer 446M may include the portion arranged between the upper conductive layer 434 and the outer insulating spacer 148.

For example, a width of the upper conductive layer 434 in the first horizontal direction (X direction) may vary in the vertical direction (Z direction). A width of the upper conductive layer 434 may have a minimum value at a certain vertical level between the bottom surface and the top surface of the upper conductive layer 434 in the vertical direction (Z direction). The width of the upper conductive layer 434 may gradually increase from the certain vertical level of the upper conductive layer 434 to a top surface of the upper conductive layer 434, and may gradually increase from the certain vertical level of the upper conductive layer 434 toward a bottom surface of the upper conductive layer 434. A width BW4 of the bottom surface of the upper conductive layer 434 may be greater than a width TW4 of the top surface of the upper conductive layer 434 in the first horizontal direction (X direction).

More detailed configurations of the upper conductive layer 434, the inner insulating spacer 442, and the main insulating spacer 446M may be substantially the same as descriptions of the upper conductive layer 134, the inner insulating spacer 142, and the main insulating spacer 146M, given with reference to FIGS. 2A and 2B.

Figure 7A:
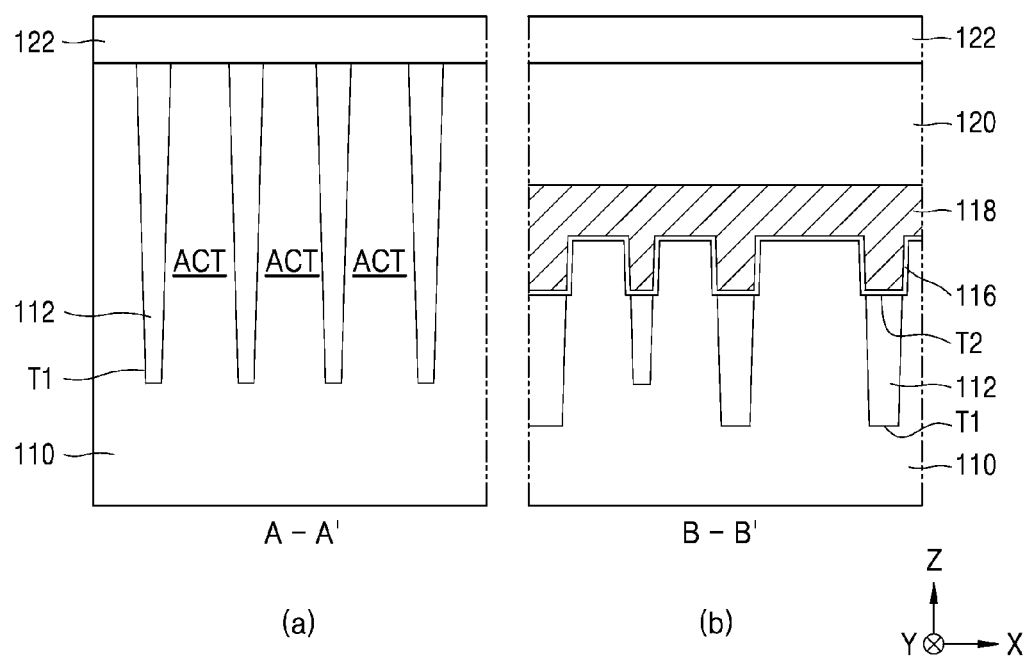
FIGS. 7A through 7Q are cross-sectional views illustrating a manufacturing method of an integrated circuit device, according to example embodiments.
Figure 7B:
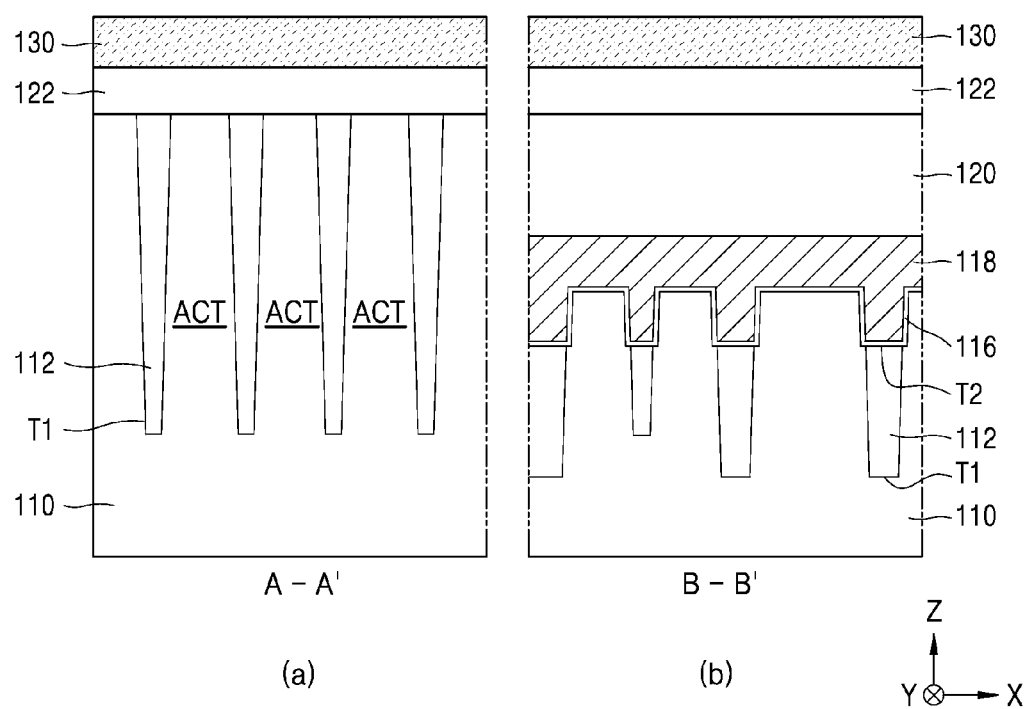
Figure 7C:
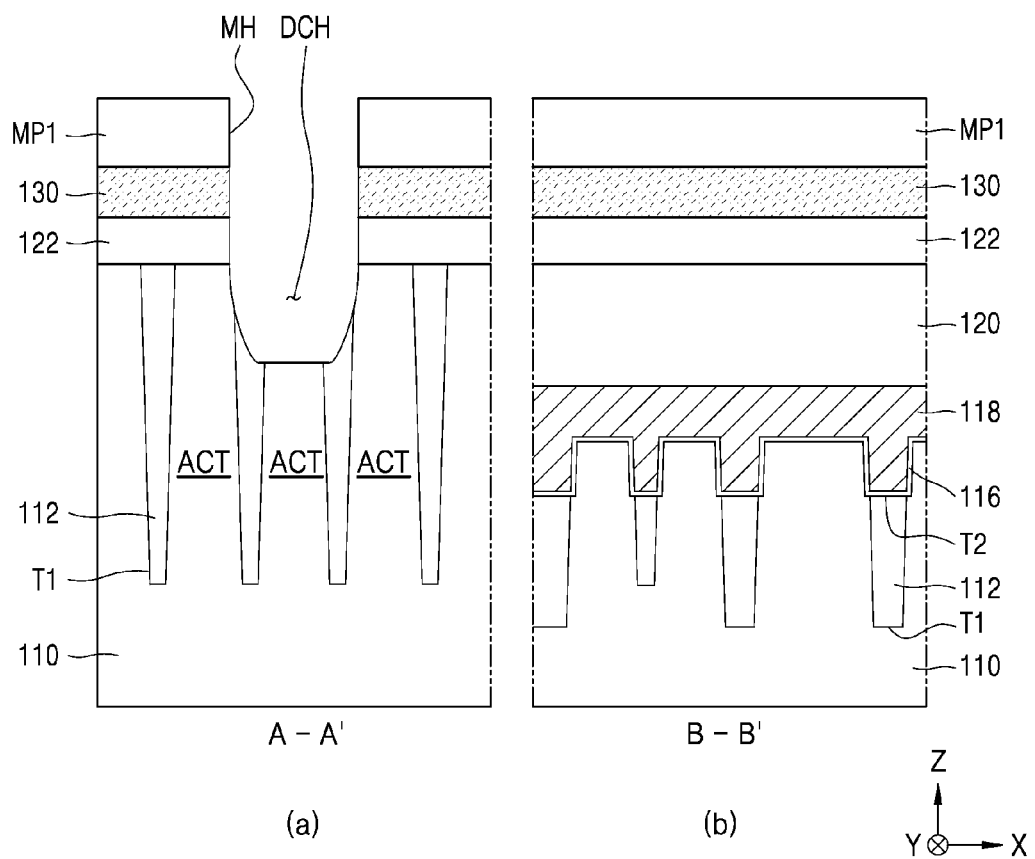
Figure 7D:
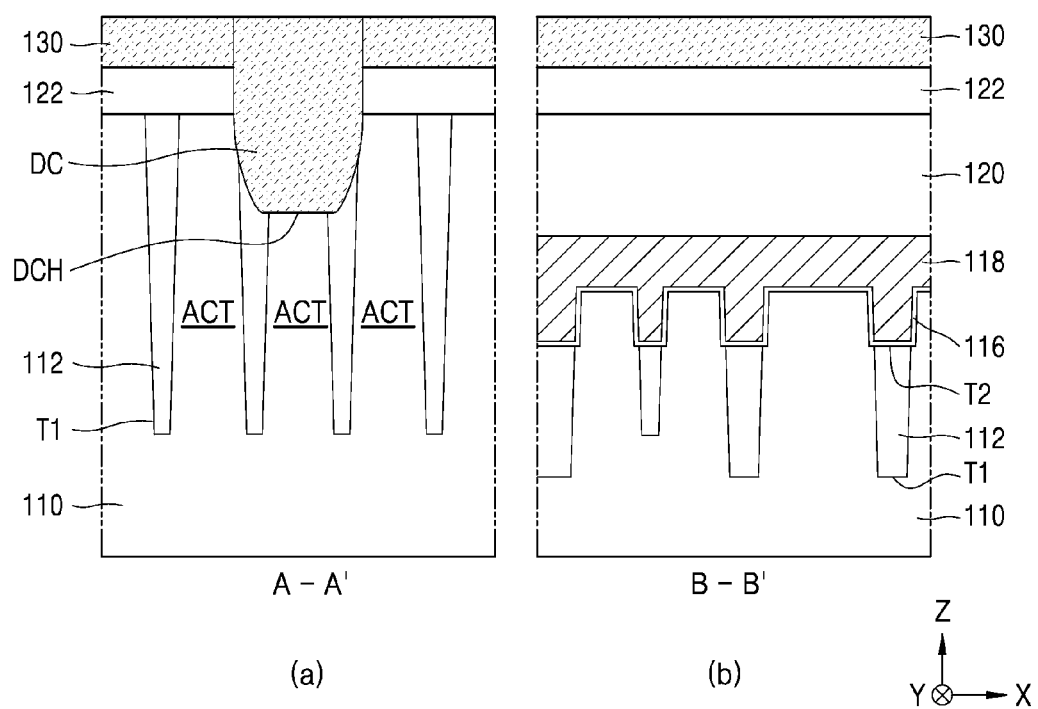
Figure 7E:
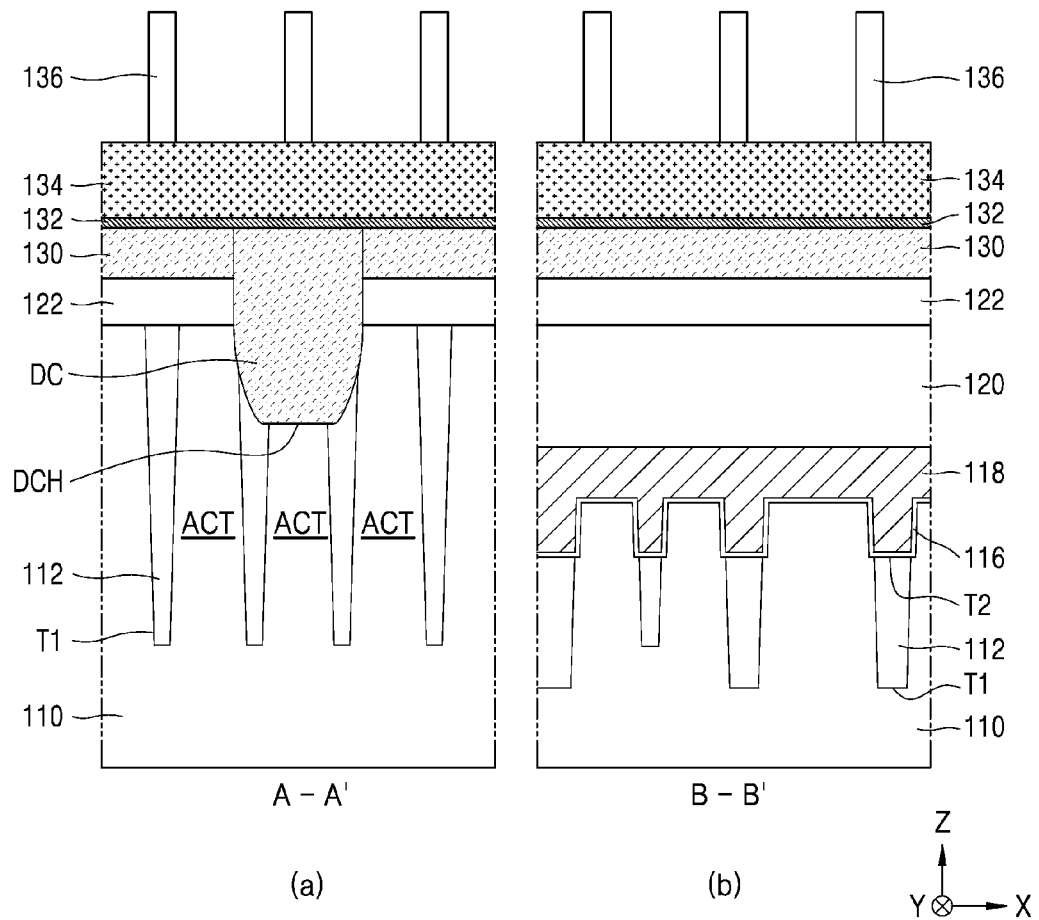
Figure 7F:
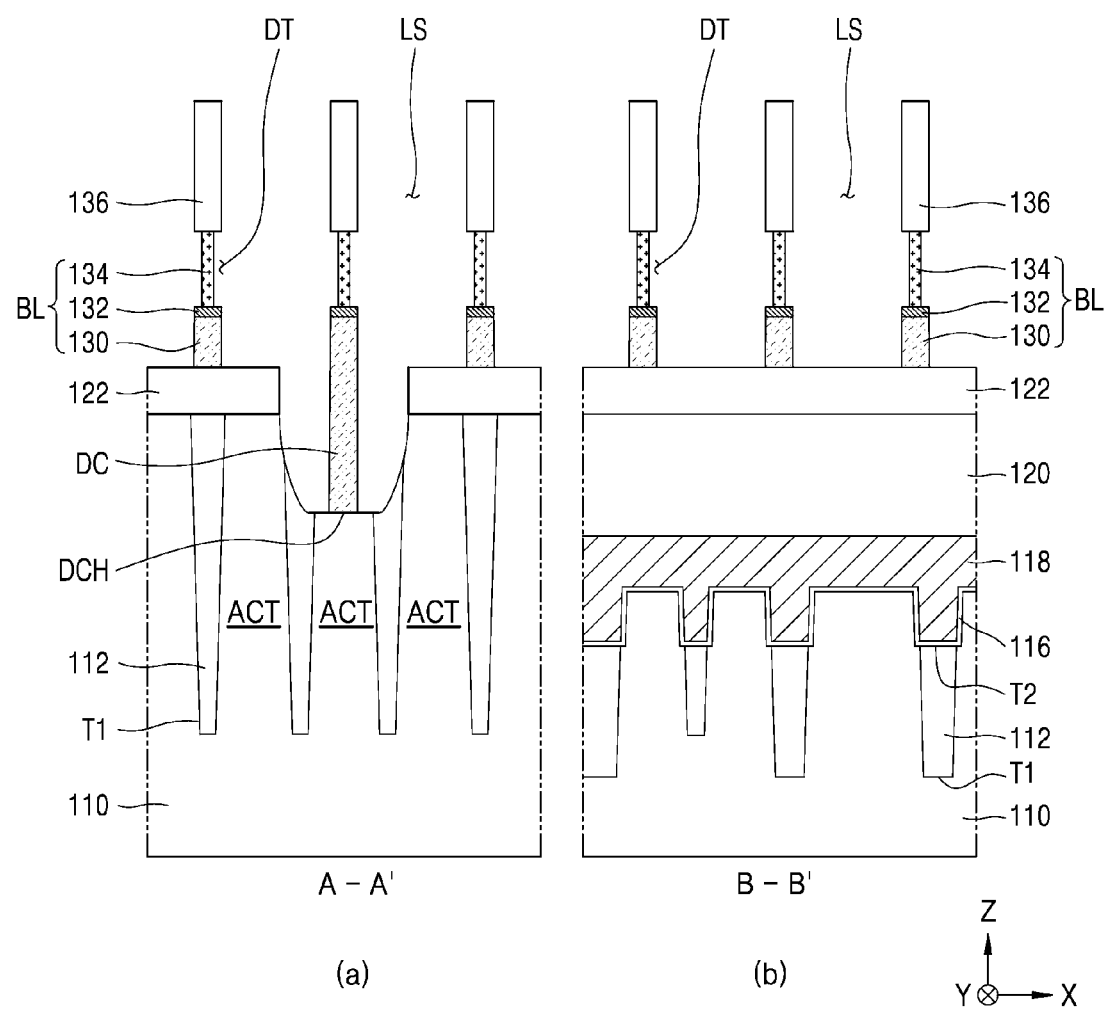
Figure 7G:
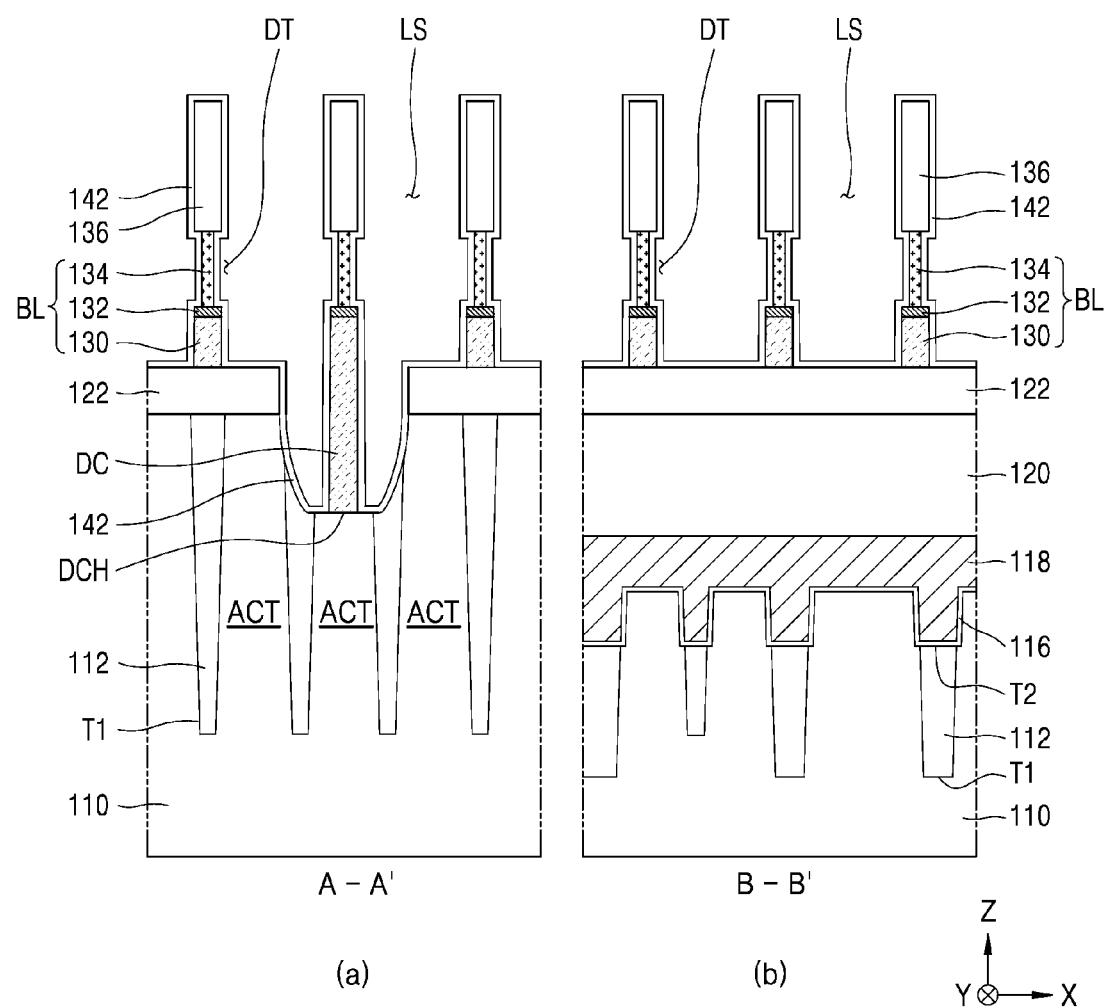
Figure 7H:
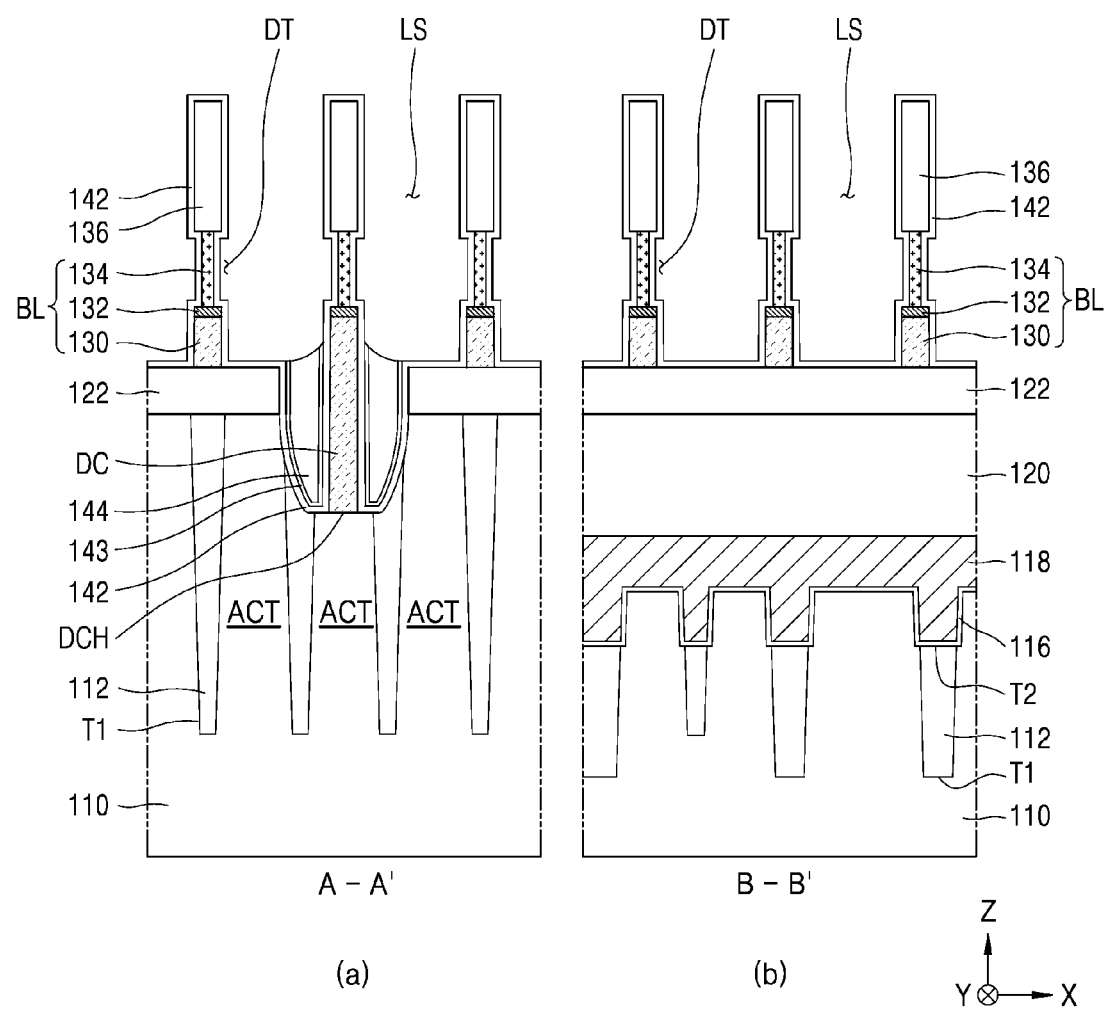
Figure 7I:
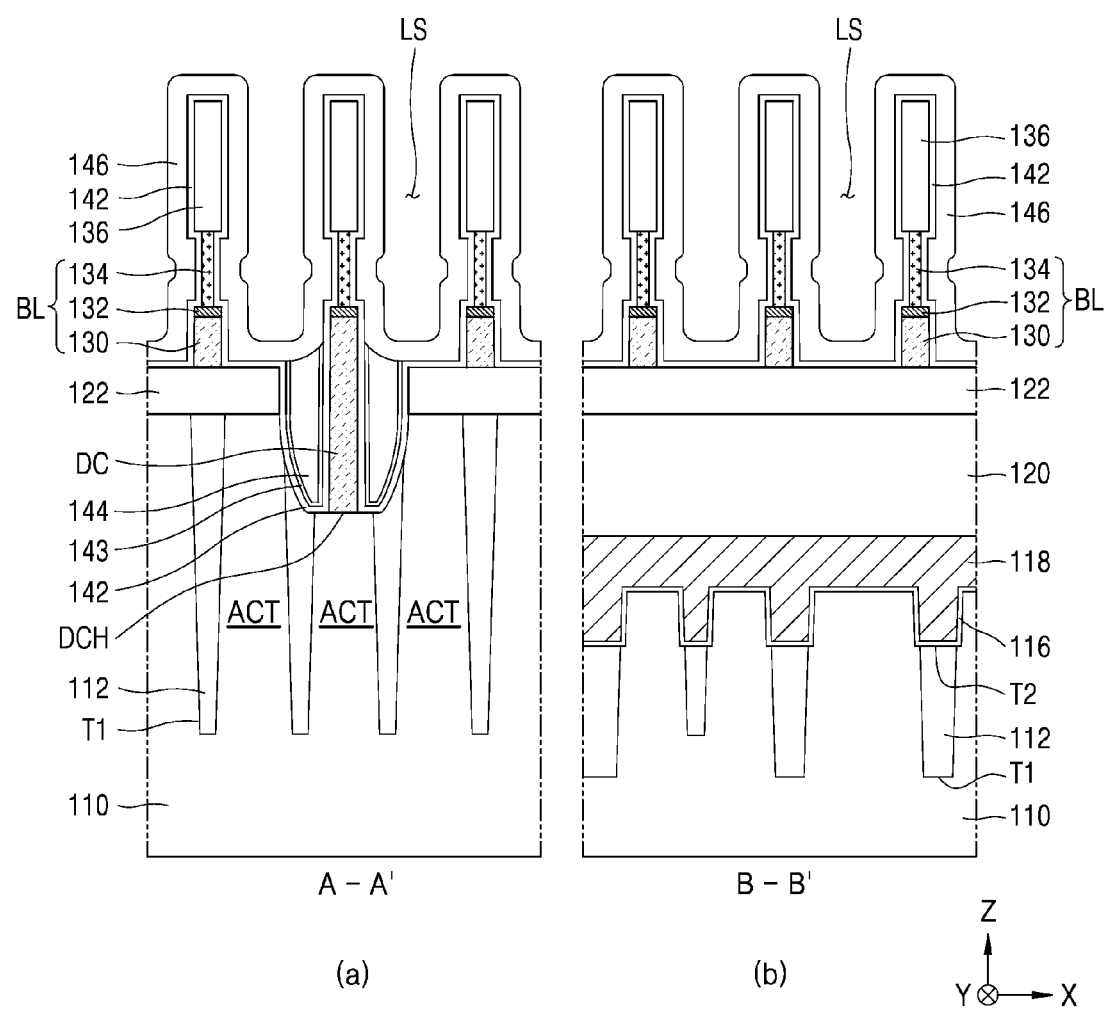
Figure 7J:
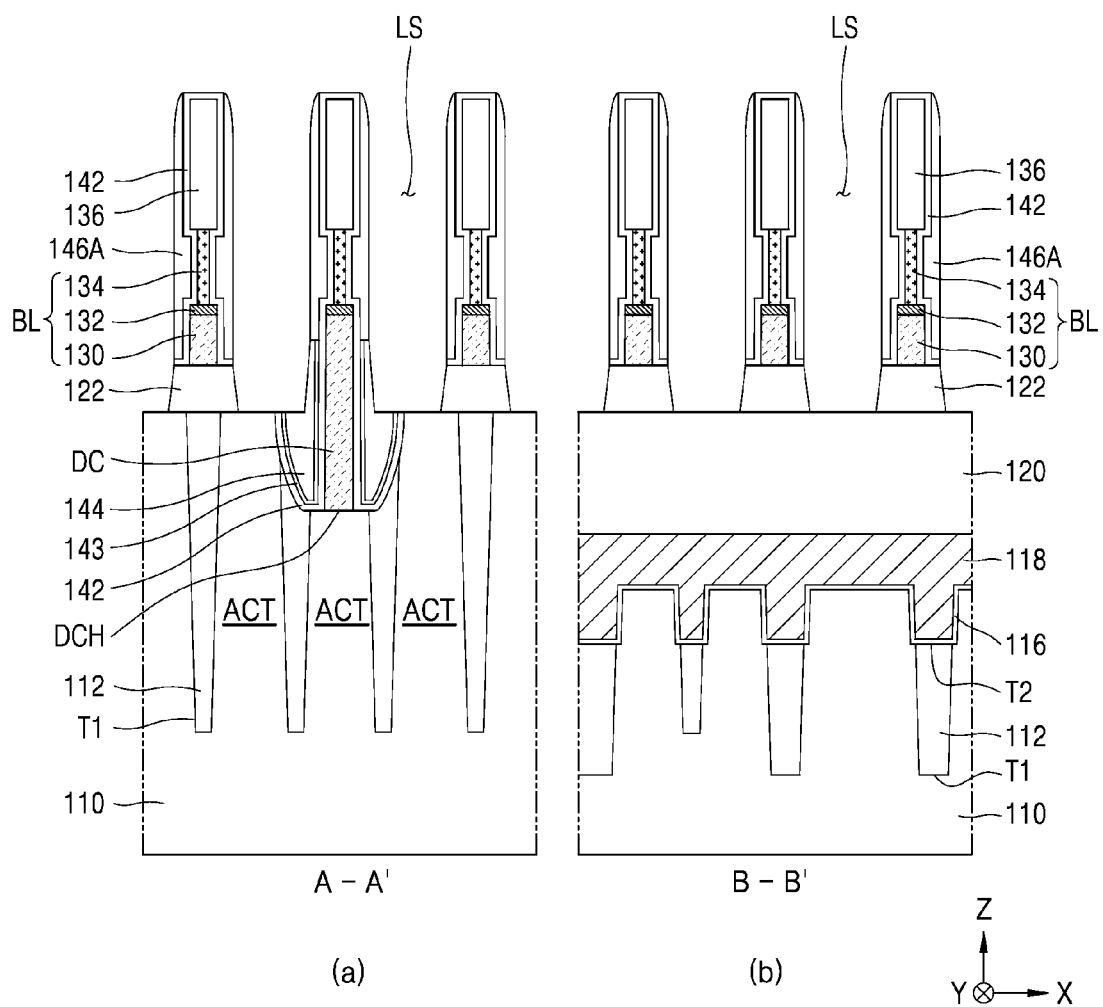
Figure 7K:
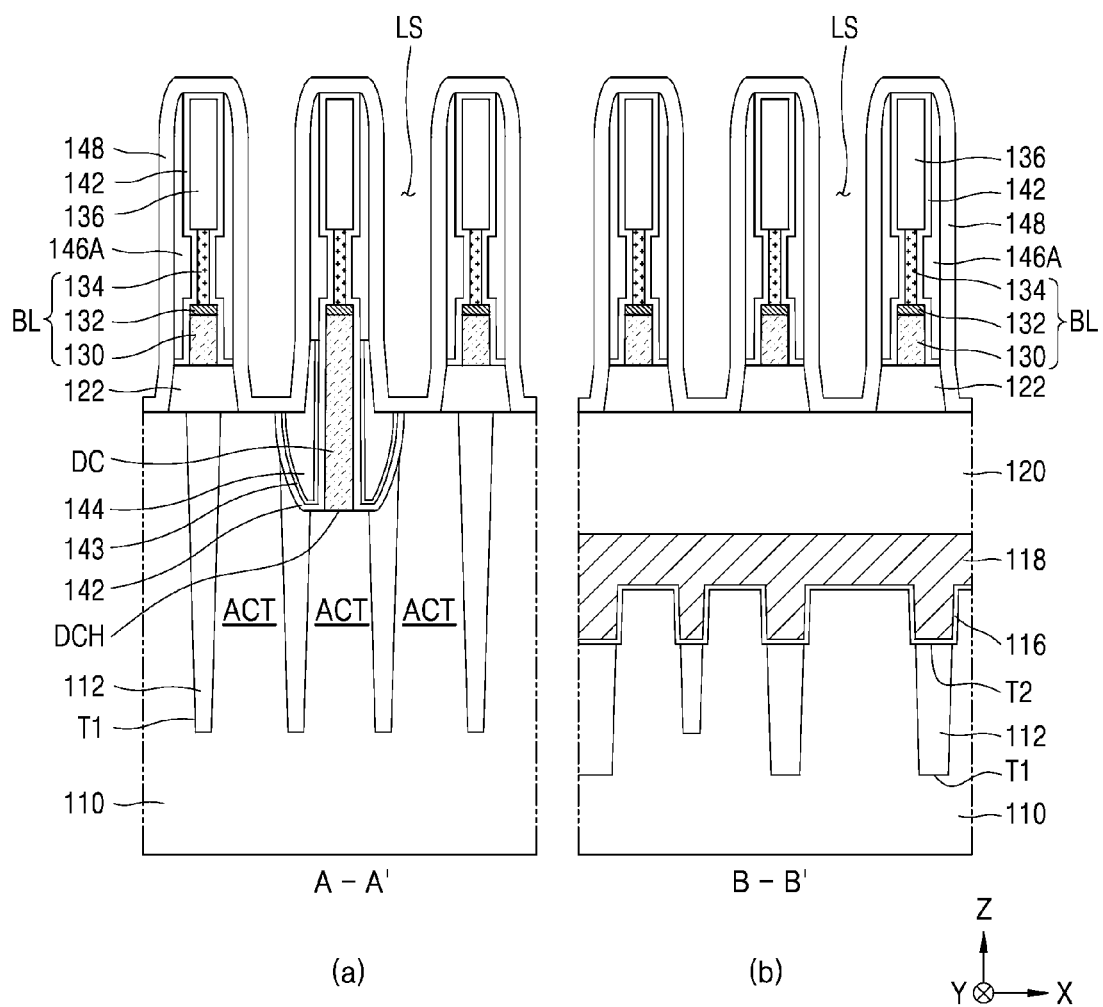
Figure 7L:
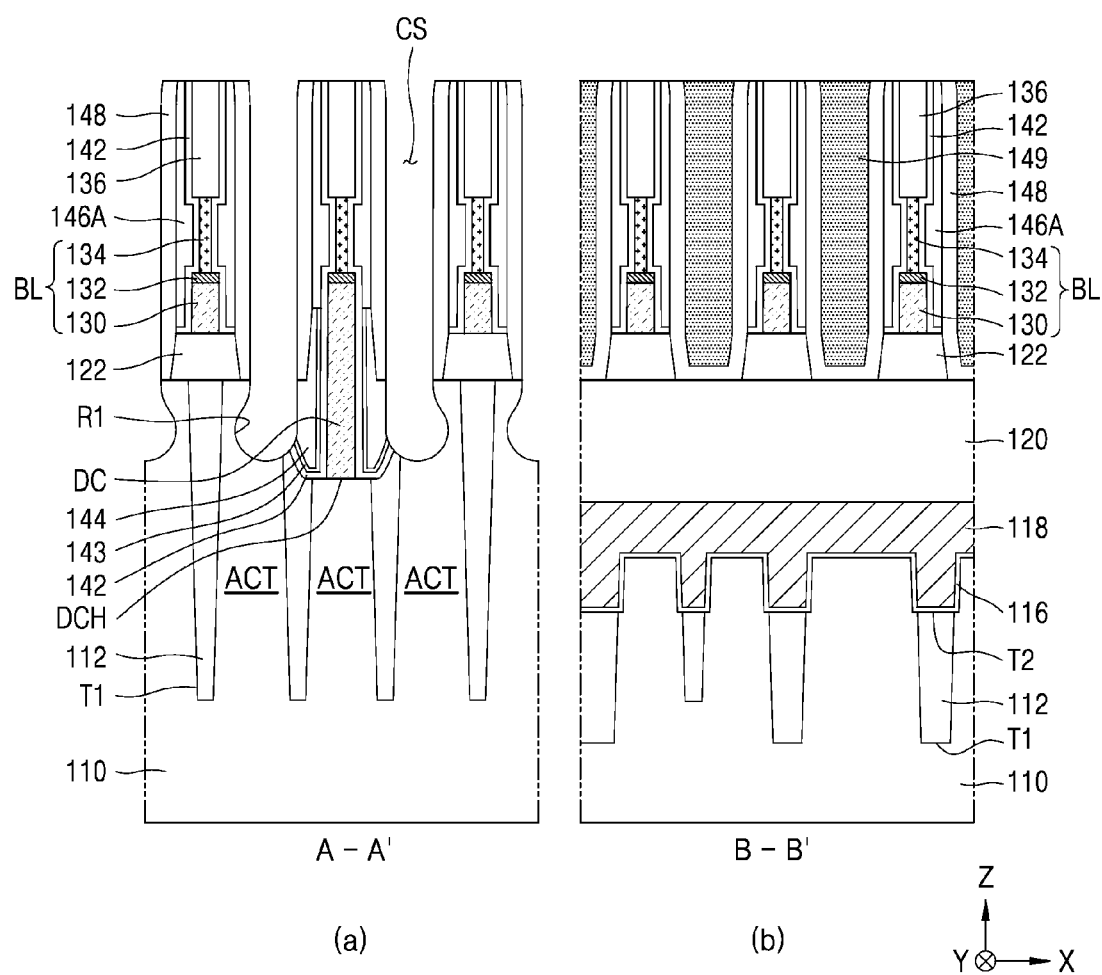
Figure 7M:
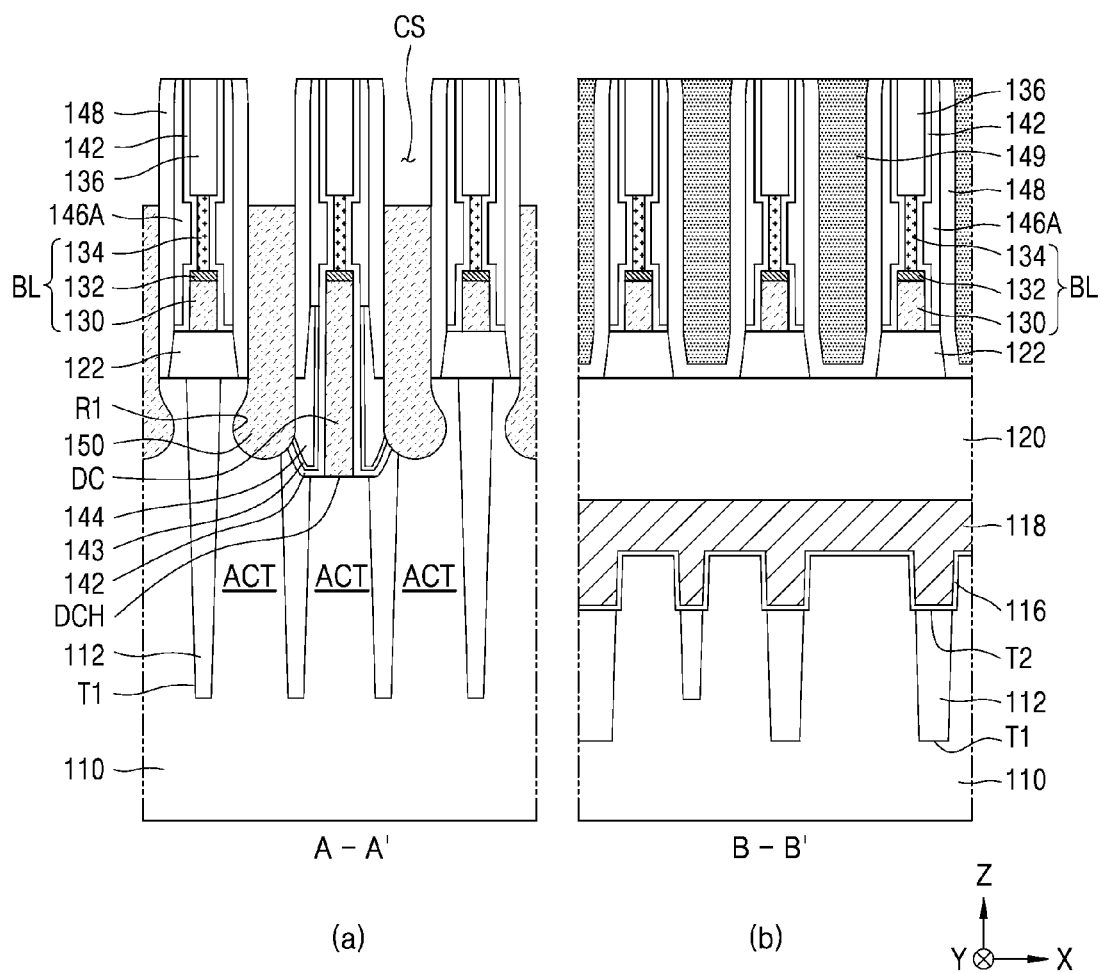
Figure 7N:
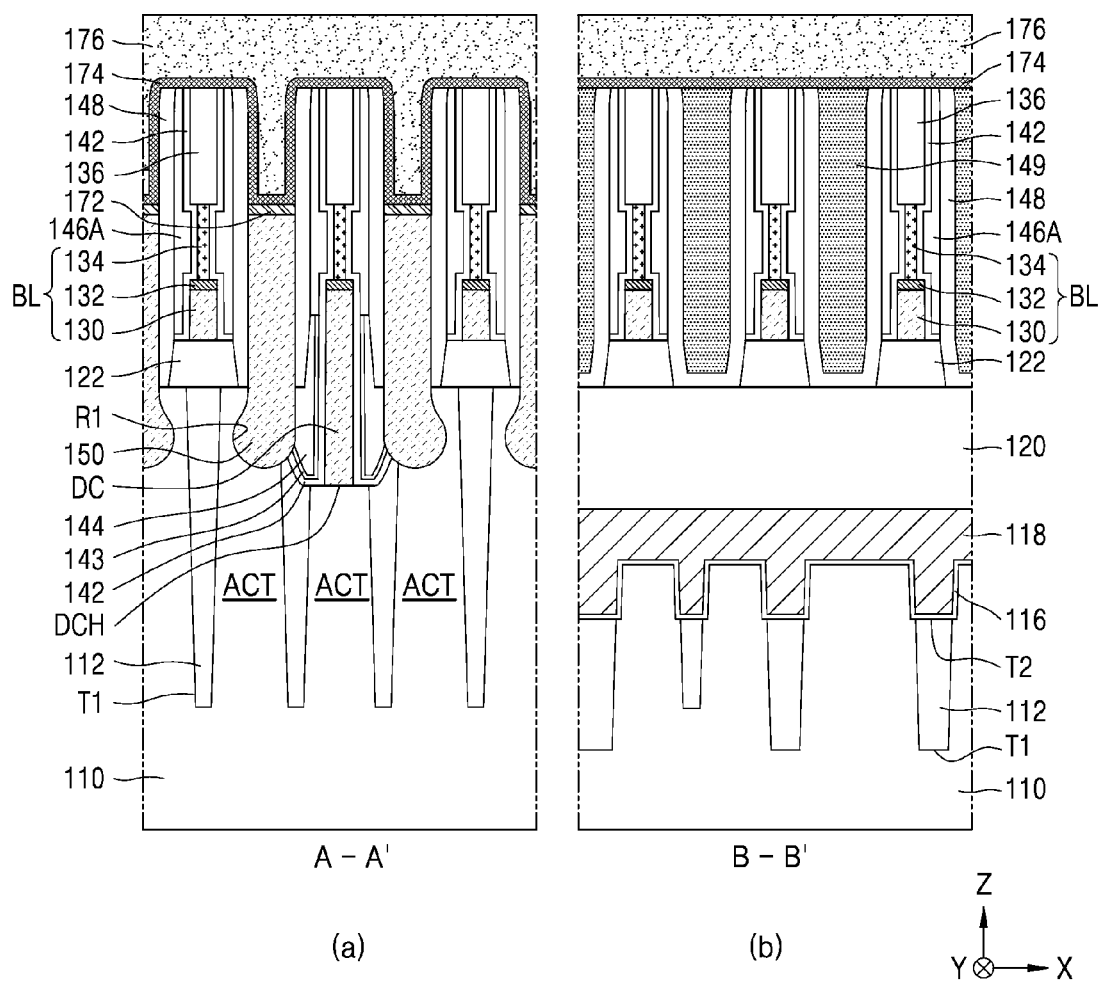
Figure 70:
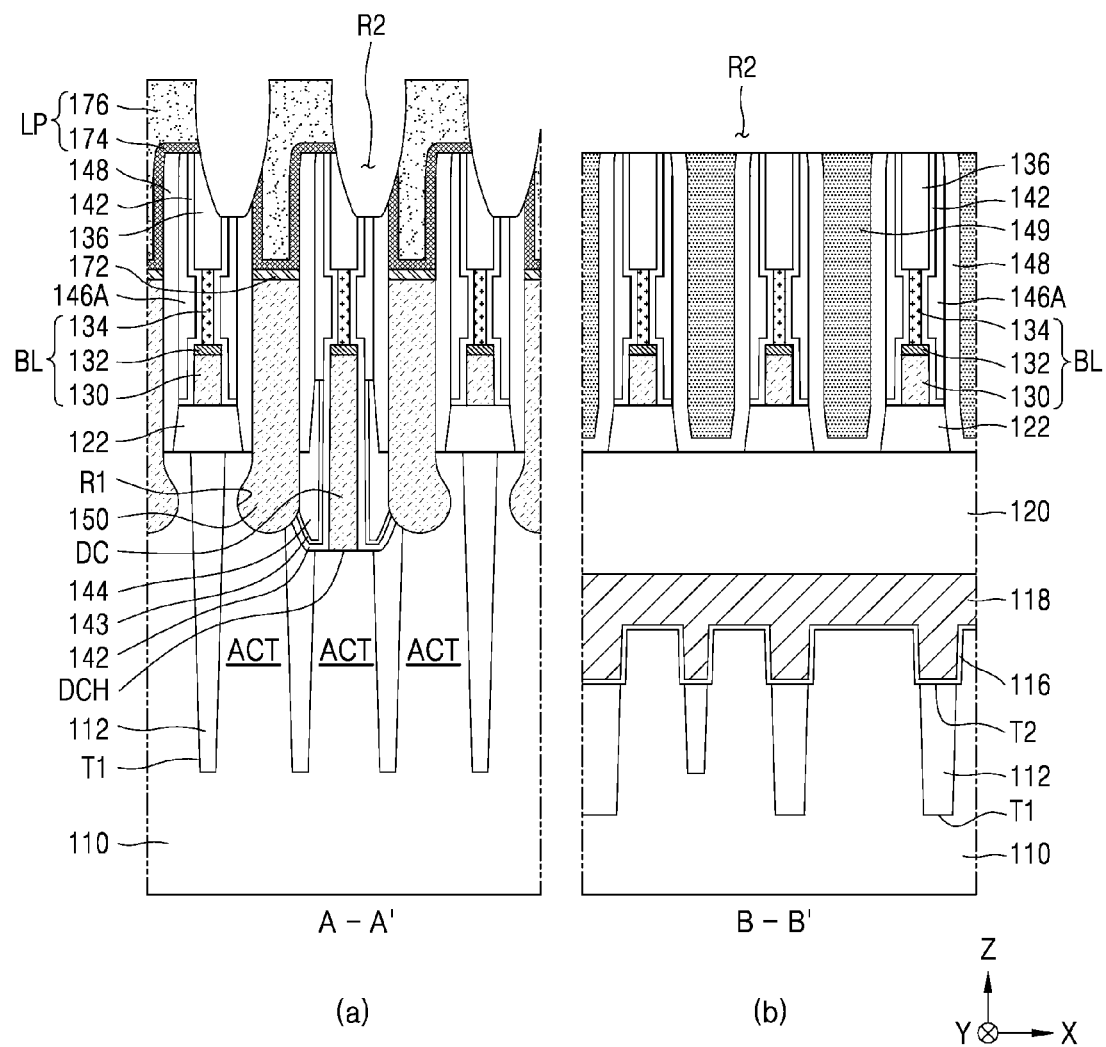
Figure 7P:
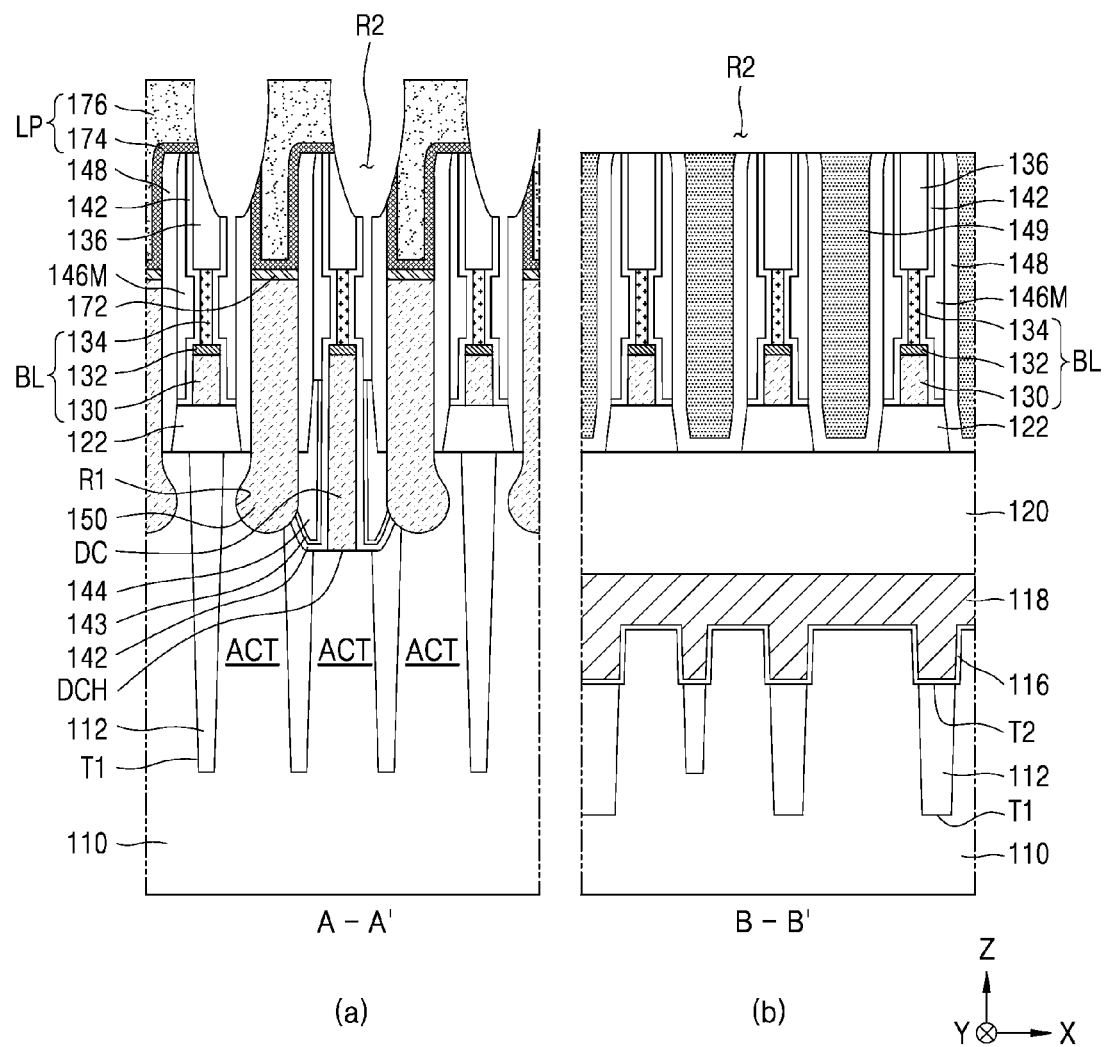
Figure 7Q:
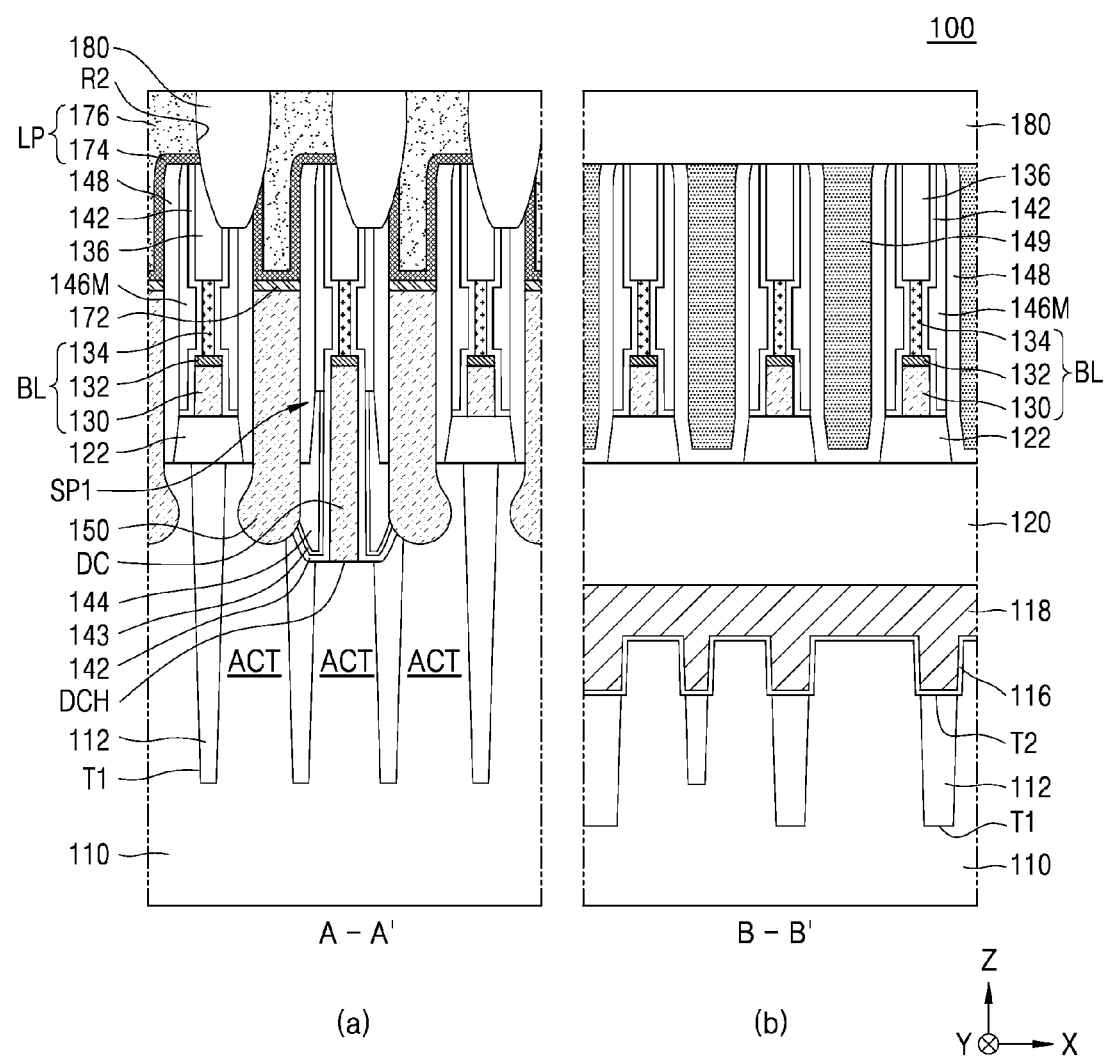

FIGS. 7A through 7Q are cross-sectional views illustrating a manufacturing method of an integrated circuit device, according to example embodiments. In FIGS. 7A through 7Q, portion (a) is a cross-sectional view of some components according to a process sequence of some region corresponding to a cross-section taken along line A-A' in FIG. 1, and portion (b) is a cross-sectional view of some components according to a process sequence of some region corresponding to a cross-section taken along line B-B' in FIG. 1. Example manufacturing methods of the integrated circuit device 100 illustrated in FIGS. 2A and 2B and the integrated circuit device 100A illustrated in FIG. 3 are described with reference to FIGS. 7A through 7Q.

Referring to FIG. 7A, the device isolation trench T1 may be formed in the substrate 110, and the device isolation layer 112 may be formed in the device isolation trench T1. The plurality of active regions ACT may be defined in the substrate 110 by the device isolation layer 112.

The plurality of word line trenches T2 may be formed in the substrate 110. The plurality of word line trenches T2 may extend parallel to each other in the first horizontal direction (X direction), and may have a line shape crossing the active region ACT. To form the plurality of word line trenches T2 including steps on the bottom surface thereof, each of the device isolation layer 112 and the substrate 110 may be etched by a separate etching process, and an etching depth of the device isolation layer 112 may be different from an etching depth of the substrate 110. After cleaning the result of forming the plurality of word line trenches T2, the gate dielectric layer 116, the word line 118, and the buried insulating layer 120 may be sequentially formed in each of the plurality of word line trenches T2. Before or after forming the plurality of word lines 118, an ion implantation process for forming a plurality of source/drain regions on the plurality of active regions ACT may be performed.

The buffer layer 122 may be formed on the substrate 110. The buffer layer 122 may cover top surfaces of the plurality of active regions ACT, a top surface of the device isolation layer 112, and top surfaces of the plurality of buried insulating layers 120. The buffer layer 122 may include a first silicon oxide layer, a silicon nitride layer, and a second silicon oxide layer sequentially formed on the substrate 110, but is not limited thereto.

Referring to FIG. 7B, the lower conductive layer 130 may be formed on the buffer layer 122. In example embodiments, the lower conductive layer 130 may include a doped polysilicon layer, but is not limited thereto.

Referring to FIG. 7C, the mask pattern MP1 may be formed on the lower conductive layer 130. After forming the mask pattern MP1, a direct contact hole DCH exposing the active region ACT of the substrate 110 may be formed by etching a portion of each of the lower conductive layer 130 exposed through an opening MH of the mask pattern MP1, the buffer layer 122 below the mask pattern MP1, the substrate 110, and the device isolation layer 112. The mask pattern MP1 may include an oxide layer, a nitride layer, or a combination thereof, but is not limited thereto.

Referring to FIG. 7D, the mask pattern MP1 may be removed from the result illustrated in FIG. 7C, and the direct contact DC may be formed in a direct contact hole DCH.

To form the direct contact DC, a doped polysilicon layer having a thickness sufficient to fill the direct contact hole DCH inside the direct contact hole DCH and on the upper portion of the lower conductive layer 130 may be formed, and then an unnecessary portion of the doped polysilicon layer may be removed so that the doped polysilicon layer remains only in the direct contact hole DCH.

Referring to FIG. 7E, the intermediate conductive layer 132, the upper conductive layer 134, and the plurality of insulating capping patterns 136 may be sequentially formed on the lower conductive layer 130 and the direct contact DC. Each of the plurality of insulating capping patterns 136 may be formed of a line pattern extending long in the second horizontal direction (Y direction).

Referring to FIG. 7F, a portion of each of the upper conductive layer 134, the intermediate conductive layer 132, the lower conductive layer 130, and the direct contact DC may be etched by using the insulating capping pattern 136 as an etching mask to form the plurality of bit lines BL on the substrate 110.

The etching process for the plurality of bit lines BL may include a first etching process for etching the upper conductive layer 134, and a second etching process for etching the intermediate conductive layer 132, the lower conductive layer 130, and the direct contact DC. In the first etching process, an etching in the vertical direction and an etching in the horizontal direction may be simultaneously performed, and in the second etching process, the etching in the horizontal direction may be minimized or hardly performed and only the etching in the vertical direction may be performed. In example embodiments, in the first etching process, a first etching gas including a combination of $Cl_2$, $SF_6$, $NF_3$, and $CF_4$ may be used, and in the second etching process, a second etching gas in which $O_2$ is added to the first etching gas may be used. In the first etching process, an etching in a lateral direction of the upper conductive layer 134 may be enhanced by etching the upper conductive layer 134 by using an etching gas that does not contain $O_2$ gas or a reduced amount of $O_2$ gas. In example embodiments, the first etching process and the second etching process may be performed at a temperature below about 20° C. to about 60° C., and at a relatively low pressure of about 10 mT or less.

The plurality of bit lines BL may include remaining portions of each of the lower conductive layer 130, the intermediate conductive layer 132, and the upper conductive layer 134. After the plurality of bit lines BL are formed, a portion of the direct contact hole DCH may be exposed around the direct contact DC again, and a line space LS extending long in the second horizontal direction (Y direction) may be defined between each of the plurality of bit line structures each including the bit line BL and the insulating capping pattern 136. Between the intermediate conductive layer 132 of the bit line BL and the insulating capping pattern 136, a dent space DT communicating with the line space LS on both sides of the upper conductive layer 134 of the bit line BL may remain. The indent space DT may include a portion overlapping the insulating capping pattern 136 in the vertical direction (Z direction).

Referring to FIG. 7G, the inner insulating spacer 142 conformally covering the exposed surfaces in the result illustrated in FIG. 7F may be formed. A chemical vapor deposition (CVD) process or an atomic layer deposition (ALD) process may be used to form the inner insulating spacer 142. The inner insulating spacer 142 may include a silicon oxide layer.

Referring to FIG. 7H, a space remaining on the inner insulating spacer 142 of the direct contact hole DCH in the result illustrated in FIG. 7G may be filled with the first gap-fill insulating pattern 143 and the second gap-fill insulating pattern 144.

In an example process for forming the first gap-fill insulating pattern 143 and the second gap-fill insulating pattern 144, a silicon oxide layer conformally covering the exposed surface of the result illustrated in FIG. 7G may be formed, and a silicon nitride layer filling the contact hole DCH may be formed on the silicon oxide layer. Each of the silicon oxide layer and the silicon nitride layer may be formed by using a CVD or ALD process. Next, the silicon nitride layer may be isotropically etched by using the silicon oxide layer as an etch stop layer, and unnecessary portions remaining on the bit line BL and the insulating capping pattern 136 of the silicon oxide layer may be removed. As a result, the first gap-fill insulating pattern 143 and the second gap-fill insulating pattern 144 including the remaining portions of each of the silicon oxide film and the silicon nitride film may be obtained.

Referring to FIG. 7I, the main insulating spacer layer 146 conformally covering surfaces exposed in the result illustrated in FIG. 7H may be formed. In the first horizontal direction (X direction), the main insulating spacer layer 146 may be formed to have a sufficiently large thickness greater than the width of the indent space DT (refer to FIG. 7H) that remains on the inner insulating spacer 142 between the intermediate conductive layer 132 and the insulating capping pattern 136.

A CVD or ALD process may be used to form the main insulating spacer layer 146. In example embodiments, the main insulating spacer layer 146 may include a silicon oxide layer.

Referring to FIG. 7J, a plurality of preliminary main insulating spacers 146A may be formed from the main insulating spacer layer 146 by anisotropically etching the main insulating spacer layer 146 obtained from the result illustrated in FIG. 7I. In each of the plurality of preliminary main insulating spacers 146A, sidewalls thereof exposed toward the line space LS may extend flat in the vertical direction (Z direction).

In example embodiments, in the process of anisotropically etching the main insulating spacer layer 146 in the result illustrated in FIG. 7I, an etching gas including $C_4F_6$, $C_4F_8$, or a combination thereof may be used to form the plurality of preliminary main insulating spacers 146A. While the main insulating spacer layer 146 is anisotropically etched, a pressure of about 80 mT or less may be maintained. For example, in the anisotropic etching of the main insulating spacer layer 146, at a level higher than the top surface of the upper conductive layer 134, during an initial etching process of anisotropically etching the main insulating spacer layer 146, the main insulating spacer layer 146 may be anisotropically etched at a comparatively high pressure of about 20 mT to about 80 mT and under a comparatively low bias power condition of about 200 W or less, and in a post-etching process of anisotropically etching the main insulating spacer layer 146 at a level the same as the upper surface of the upper conductive layer 134 or less, the main insulating spacer layer 146 may be anisotropically etched at a comparatively low pressure of about 40 mT or less and under a comparatively high bias power condition of about 200 W or more. While the main insulating spacer layer 146 is anisotropically etched, the etching process temperature may be maintained at about 20° C. to about 60° C. To obtain a structure in which the sidewalls exposed toward the line space LS from each of the plurality of preliminary main insulating spacers 146A extend flat in the vertical direction (Z direction), the content of the $O_2$ gas included in the etching gas used in the initial etching process and the post-etching process may be adjusted. For example, as the content of the $O_2$ gas included in the etching gas used in the initial etching process and the post-etching process is less, the etching in the lateral direction may be enhanced.

While the main insulating spacer layer 146 is anisotropically etched from the result illustrated in FIG. 7I, a portion of the inner insulating spacer 142 and a portion of the buffer layer 122 may be removed. As a result, a portion of the substrate 110, a portion of the inner insulating spacer 142, a portion of the first gap-fill insulating pattern 143, and a portion of the second gap-fill insulating pattern 144 at the bottom of the plurality of line spaces LS may be exposed. Each of the plurality of preliminary main insulating spacers 146A may cover a sidewall of the bit line BL and a sidewall of the insulating capping pattern 136 on the inner insulating spacer 142.

Referring to FIG. 7K, the outer insulating spacer 148 conformally covering the result illustrated in FIG. 7J may be formed. The outer insulating spacer 148 may include a material having an etch selectivity with respect to the plurality of preliminary main insulating spacers 146A. For example, when the preliminary main insulating spacer 146A includes a silicon oxide layer, the outer insulating spacer 148 may include a silicon nitride layer. A CVD or ALD process may be used to form the outer insulating spacer 148.

Referring to FIG. 7L, the line space LS may be divided into a plurality of contact spaces CS by forming the plurality of insulating fences 149 apart from each other in the line space LS defined by the outer insulating spacer 148 between each of the bit lines BL from the result illustrated in FIG. 7K.

Each of the plurality of insulating fences 149 may vertically overlap the word line 118 on the word line 118. The plurality of insulating fences 149 may include a silicon nitride layer. In example embodiments, while the plurality of insulating fences 149 are formed, a portion of the plurality of insulating capping patterns 136 may be consumed, and a height of the plurality of insulating capping patterns 136 may be reduced.

Next, by removing a portion of structures that are exposed via the plurality of contact spaces CS, the plurality of recess spaces R1 that expose the active region ACT of the substrate 110 between each of the plurality of bit lines BL may be formed. To form the plurality of recess spaces R1, an anisotropic etching process or a combination of an anisotropic etching process and an isotropic etching process may be used. For example, the plurality of recess spaces R1 may be formed by anisotropically etching a portion of the outer insulating spacer 148 exposed via the plurality of contact spaces CS between each of the plurality of bit lines BL and a portion of the substrate 110 under the outer insulating spacer 148, and by isotropically etching a portion of the active region ACT of the substrate that is exposed as a result of the anisotropical etching. Each of the plurality of recess spaces R1 may communicate with the contact space CS. While the etching process for forming the contact space CS is performed, a portion of each of the inner insulating spacer 142, the first gap-fill insulating pattern 143, and the second gap-fill insulating pattern 144 may be consumed at a level lower than the top surface of the substrate 110.

A portion of the active region ACT of the substrate 110, a portion of the inner insulating spacer 142, a portion of the first gap-fill insulating pattern 143, and a portion of the second gap-fill insulating pattern 144 may be exposed via the plurality of recess spaces R1.

Referring to FIG. 7M, the plurality of contact plugs 150 filling a portion of the contact space CS between each of the plurality of bit lines BL while filling the plurality of recess spaces R1 between each of a plurality of bit lines BL may be formed.

Referring to FIG. 7N, the metal silicide layer 172, the conductive barrier layer 174, and the conductive layer 176 may be sequentially formed on the plurality of contact plugs 150 that are exposed via the plurality of contact spaces CS (refer to FIG. 7M).

The contact plug 150 and the metal silicide layer 172 may form at least a portion of the buried contact BC illustrated in FIG. 1. Each of the conductive barrier layer 174 and the conductive layer 176 may fill the plurality of contact spaces CS (refer to FIG. 7M) and may extend to the upper portion of the insulating capping pattern 136 to vertically overlap a portion of the plurality of bit lines BL.

Referring to FIG. 7O, a mask pattern exposing a portion of the conductive layer 176 may be formed on the conductive layer 176 from the result illustrated in FIG. 7N, an upper recess space R2 may be formed by etching the conductive layer 176, the conductive barrier layer 174, and the insulating layers therearound by using the mask pattern as an etching mask, and the plurality of conductive landing pads LP defined by the upper recess space R2 may be formed. The mask pattern may include a silicon nitride layer, but is not limited thereto.

The plurality of conductive landing pads LP may include the conductive barrier layer 174 and the conductive layer 176 remaining on the substrate 110 after the upper recess space R2 is formed. The plurality of conductive landing pads LP may extend from the space between each of the plurality of insulating capping patterns 136 to the upper portion of each of the plurality of insulating capping patterns 136 so that the plurality of conductive landing pads LP vertically overlap a portion of the plurality of bit lines BL. The plurality of conductive landing pads LP may have a plurality of island-type pattern shapes. Portions of the plurality of conductive landing pads LP extending in the horizontal direction from the outside of the contact space CS may constitute the plurality of conductive landing pads LP illustrated in FIG. 1. Top surfaces of the plurality of preliminary main insulating spacers 146A may be exposed via the upper recess space R2.

Referring to FIG. 7P, the main insulating spacer 146M including an air spacer may be formed by removing at least a portion of the plurality of preliminary main insulating spacers 146A exposed via the upper recess space R2 from the result illustrated in FIG. 7O. As discussed above, the outer insulating spacer 148 may include a material having an etch selectivity with respect to the plurality of preliminary main insulating spacers 146A. Therefore, as an example, the portion of the plurality of preliminary main insulating spacers 146A may be removed through an etching process.

In some example embodiments, the process described with reference to FIG. 7P is omitted. When the process described with reference to FIG. 7P is omitted, the main insulating spacer 146M illustrated in FIGS. 2A and 2B may be obtained from the preliminary main insulating spacer 146A illustrated in FIG. 7O. In this case, the main insulating spacer 146M may include a silicon oxide film.

In other example embodiments, the plurality of preliminary main insulating spacers 146A exposed via the upper recess space R2 from the result illustrated in FIG. 7O may be completely removed. In this case, the main insulating spacer 146M may include an air spacer, and the air spacer constituting the main insulating spacer 146M in the result illustrated in FIG. 7P may communicate with the upper recess space R2. The inner insulating spacer 142 may be exposed at the bottom of the air spacer constituting the main insulating spacer 146M.

In addition, in other example embodiments, the main insulating spacer 146N illustrated in FIG. 3 may be formed by partially removing the plurality of preliminary main insulating spacers 146A exposed via the upper recess space R2 from the result illustrated in FIG. 7O. As described with reference to FIG. 3, the main insulating spacer 146N may include the air spacer AS and the main insulating spacer pattern 146P. After a portion of the preliminary main insulating spacer 146A illustrated in FIG. 7O is removed through the upper recess space R2 according to the process described with reference to FIG. 7P, the main insulating spacer pattern 146P may be the other portion of the preliminary main insulating spacer 146A that remains on the substrate 110.

Referring to FIG. 7Q, the plurality of conductive landing pads LP may be electrically insulated from each other by filling the upper recess space R2 around the plurality of conductive landing pads LP from the result illustrated in FIG. 7P. Next, a plurality of capacitor lower electrodes capable of being electrically connected to the plurality of conductive landing pads LP may be formed on the insulating layer 180.

In the above, example manufacturing methods of the integrated circuit device 100 illustrated in FIGS. 2A and 2B and the integrated circuit device 100A illustrated in FIG. 3 have been described with reference to FIGS. 7A through 7Q. However, it should be understood by those skilled in the art that, from descriptions given with reference to FIGS. 7A through 7Q, integrated circuit devices having various structures which are modified and changed from the integrated circuit devices 200, 300, and 400 illustrated in FIGS. 4 through 6 and within the scope of the technical idea may be manufactured. For example, to manufacture the integrated circuit devices 200, 300, and 400 illustrated in FIGS. 4 through 6, the upper conductive layer 234 illustrated in FIG. 4, the upper conductive layer 334 illustrated in FIG. 5, or the upper conductive layer 434 illustrated in FIG. 6 may be formed instead of the upper conductive layer 134 by variously modifying conditions of the first etching process for etching the upper conductive layer 134 in the forming process of the plurality of bit lines BL described with reference to FIG. 7F. Thereafter, integrated circuit devices having various structures may be manufactured by performing processes described with reference to FIGS. 7G through 7Q.

While aspects of example embodiments have been particularly shown and described, it will be understood that various changes in form and details may be made therein without departing from the spirit and scope of the following claims.

What is claimed is:

1. An integrated circuit device comprising:
   a bit line on a substrate, the bit line comprising a lower conductive layer and an upper conductive layer;
   an insulating capping pattern on the bit line; and
   a main insulating spacer on a sidewall of the bit line and a sidewall of the insulating capping pattern, the main insulating spacer comprising an extended portion opposite the upper conductive layer, the extended portion protruding toward the upper conductive layer compared to a portion of the main insulating spacer opposite the lower conductive layer,
   wherein the extended portion of the main insulating spacer fills an undercut space corresponding to a sidewall of the upper conductive layer and a bottom surface of the insulating capping pattern, and
   wherein the extended portion of the main insulating spacer and the portion of the main insulating spacer opposite the lower conductive portion form a continuous portion of a common material.

2. The integrated circuit device of claim 1, wherein the sidewall of the bit line is oblique with respect to a surface of the substrate.

3. The integrated circuit device of claim 1, wherein a width of the upper conductive layer is less in a horizontal direction than that of each of the insulating capping pattern and the lower conductive layer.

4. The integrated circuit device of claim 1, further comprising a contact plug spaced apart from the bit line in a horizontal direction and connected to an active region of the substrate, the main insulating spacer being interposed between the contact plug and the bit line,
   wherein the main insulating spacer comprises:
      a first portion facing the insulating capping pattern and having a first width in the horizontal direction,
      a second portion facing the upper conductive layer and having a second width in the horizontal direction, the second width being greater than the first width, and
      a third portion facing the lower conductive layer and having a third width in the horizontal direction, the third width being less than the second width.

5. The integrated circuit device of claim 1, wherein the sidewall of the upper conductive layer comprises a slanted sidewall facing the extended portion of the main insulating spacer, and
wherein a width of a portion of the main insulating spacer facing the upper conductive layer in a horizontal direction gradually increases from a bottom surface of the upper conductive layer to a top surface of the upper conductive layer.

6. The integrated circuit device of claim 1, wherein the sidewall of the upper conductive layer comprises a nonlinear sidewall that is concave toward the extended portion,
wherein the main insulating spacer comprises:
a first portion facing the insulating capping pattern and having a first width in a horizontal direction, and
a second portion facing the nonlinear sidewall of the upper conductive layer and having a second width in the horizontal direction, the second width being greater than the first width.

7. The integrated circuit device of claim 1, wherein the sidewall of the upper conductive layer comprises a nonlinear sidewall that is concave toward the extended portion, and
wherein a width of a bottom surface of the upper conductive layer is greater than a width of a top surface of the upper conductive layer.

8. The integrated circuit device of claim 1, further comprising an inner insulating spacer on the sidewall of the bit line and the sidewall of the insulating capping pattern, the inner insulating spacer comprising a portion interposed between the upper conductive layer and the extended portion,
wherein the inner insulating spacer nonlinearly extends in a vertical direction.

9. The integrated circuit device of claim 1, further comprising:
an inner insulating spacer interposed between the upper conductive layer and the extended portion; and
an outer insulating spacer spaced apart from the inner insulating spacer, the main insulating spacer being interposed between the outer insulating spacer and the inner insulating spacer,
wherein the main insulating spacer comprises an air spacer, a width of which corresponds to a distance between the inner insulating spacer and the outer insulating spacer.

10. An integrated circuit device comprising:
a bit line comprising a lower conductive layer and an upper conductive layer on the lower conductive layer in a vertical direction, the lower conductive layer being on a substrate and the upper conductive layer having a width less than a width of the lower conductive layer in a horizontal direction;
an insulating capping pattern on the upper conductive layer in the vertical direction, the insulating capping pattern having a width greater than the width of the upper conductive layer in the horizontal direction; and
a main insulating spacer on a sidewall of the bit line and a sidewall of the insulating capping pattern, the main insulating spacer comprising an extended portion that is convex toward the upper conductive layer,
wherein the width of the upper conductive layer in the horizontal direction varies along the vertical direction.

11. The integrated circuit device of claim 10, wherein the extended portion of the main insulating spacer comprises a portion which overlaps the insulating capping pattern in the vertical direction.

12. The integrated circuit device of claim 10, wherein the main insulating spacer comprises a first portion facing the insulating capping pattern in the horizontal direction, a second portion facing the upper conductive layer in the horizontal direction, and a third portion facing the lower conductive layer in the horizontal direction, and
wherein a width of the second portion is greater than a width of each of the first portion and the third portion.

13. The integrated circuit device of claim 10, further comprising:
a contact plug spaced apart from the bit line in the horizontal direction and connected to an active region of the substrate, the main insulating spacer being interposed between the contact plug and the bit line;
an inner insulating spacer between the upper conductive layer and the extended portion and covering the sidewall of the bit line; and
an outer insulating spacer between the main insulating spacer and the contact plug and covering the sidewall of the bit line,
wherein the main insulating spacer comprises a first sidewall that faces the inner insulating spacer along the extended portion and is convex toward the upper conductive layer, and a second sidewall that faces the outer insulating spacer on an opposite side of the extended portion in the horizontal direction and is linear along the vertical direction.

14. An integrated circuit device comprising:
a substrate comprising a plurality of active regions apart from each other, the plurality of active regions comprising a first active region and a second active region adjacent to the first active region;
a bit line connected to the first active region and comprising a lower conductive layer and an upper conductive layer stacked on the substrate in a vertical direction;
an insulating capping pattern on the bit line;
a contact plug adjacent to the bit line in a horizontal direction, the contact plug being connected to the second active region; and
a spacer structure between the bit line and the contact plug,
wherein the spacer structure comprises a main insulating spacer comprising an extended portion opposite the upper conductive layer, the extended portion protruding toward the upper conductive layer compared to a portion of the main insulating spacer opposite the lower conductive layer,
wherein the extended portion of the main insulating spacer fills an undercut space corresponding to a sidewall of the upper conductive layer and a bottom surface of the insulating capping pattern, and
wherein the extended portion of the main insulating spacer and the portion of the main insulating spacer opposite the lower conductive portion form a continuous portion of a common material.

15. The integrated circuit device of claim 14, wherein a width of the upper conductive layer in the horizontal direction is less than a width of each of the lower conductive layer and the insulating capping pattern.

16. The integrated circuit device of claim 14, wherein the spacer structure further comprises an inner insulating spacer between the bit line and the main insulating spacer, and
wherein the inner insulating spacer comprises a bent portion between the bottom surface of the insulating capping pattern and the extended portion.

17. The integrated circuit device of claim 14, wherein the spacer structure further comprises an outer insulating spacer between the main insulating spacer and the contact plug,
  wherein the main insulating spacer comprises a first portion between the insulating capping pattern and the outer insulating spacer, a second portion between the upper conductive layer and the outer insulating spacer, and a third portion between the lower conductive layer and the outer insulating spacer, and
  wherein a width of the second portion is greater than a width of each of the first portion and the third portion.

\* \* \* \* \*